United States Patent
Oohashi

(10) Patent No.: US 10,629,464 B2
(45) Date of Patent: *Apr. 21, 2020

(54) PLASMA PROCESSING APPARATUS AND HEATER TEMPERATURE CONTROL METHOD

(71) Applicant: Tokyo Electron Limited, Tokyo (JP)

(72) Inventor: Kaoru Oohashi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/013,189

(22) Filed: Jun. 20, 2018

(65) Prior Publication Data

US 2018/0301362 A1    Oct. 18, 2018

Related U.S. Application Data

(60) Continuation of application No. 15/428,313, filed on Feb. 9, 2017, now Pat. No. 10,026,631, which is a (Continued)

(30) Foreign Application Priority Data

Jan. 13, 2012 (JP) .................................. 2012-005590

(51) Int. Cl.
*H01L 21/67* (2006.01)
*H01L 21/683* (2006.01)
(Continued)

(52) U.S. Cl.
CPC .. *H01L 21/67248* (2013.01); *H01J 37/32082* (2013.01); *H01J 37/32642* (2013.01); (Continued)

(58) Field of Classification Search
CPC ......... H01J 2237/334; H01J 2237/2001; H01J 37/32724; H01J 37/32935; H01L 21/3065;
(Continued)

(56) References Cited

U.S. PATENT DOCUMENTS 5,668,524 A    9/1997 Aida et al.
5,766,363 A    6/1998 Mizuno et al.
(Continued)

FOREIGN PATENT DOCUMENTS

JP    2008-085329    4/2008
JP    2008-177285    7/2008
(Continued)

*Primary Examiner* — Sophia T Nguyen
(74) *Attorney, Agent, or Firm* — IPUSA, PLLC

(57) ABSTRACT

A method is provided for controlling a temperature of a heater arranged in a plasma processing apparatus that converts a gas into plasma using a high frequency power and performs a plasma process on a workpiece with the plasma. The plasma processing apparatus includes a processing chamber that can be depressurized, a mounting table that is arranged within the processing chamber, an electrostatic chuck that is arranged on the mounting table and electrostatically attracts the workpiece, and a heater that is arranged within or near the electrostatic chuck and is divided into a plurality of heater zones. The method includes adjusting a control temperature of the heater with respect to each of the heater zones, and correcting a temperature interference from an adjacent heater zone of each of the heater zones with respect to a setting temperature of each of the heater zones upon adjusting the control temperature.

4 Claims, 19 Drawing Sheets

Related U.S. Application Data division of application No. 14/368,548, filed as application No. PCT/JP2013/050195 on Jan. 9, 2013, now abandoned.

(60) Provisional application No. 61/587,706, filed on Jan. 18, 2012.

(51) Int. Cl.

| | |
|---|---|
| *H01J 37/32* | (2006.01) |
| *H01L 21/3065* | (2006.01) |
| *H02N 13/00* | (2006.01) |
| *H01L 21/311* | (2006.01) |
| *H01L 21/3213* | (2006.01) |
| *H01L 21/66* | (2006.01) |

(52) U.S. Cl.
CPC .. *H01J 37/32724* (2013.01); *H01J 37/32935* (2013.01); *H01L 21/3065* (2013.01); *H01L 21/31116* (2013.01); *H01L 21/31138* (2013.01); *H01L 21/31144* (2013.01); *H01L 21/32137* (2013.01); *H01L 21/67069* (2013.01); *H01L 21/67103* (2013.01); *H01L 21/67109* (2013.01); *H01L 21/6831* (2013.01); *H01L 21/6833* (2013.01); *H01L 22/26* (2013.01); *H02N 13/00* (2013.01); *H01J 37/32091* (2013.01); *H01J 37/32183* (2013.01); *H01J 2237/2001* (2013.01); *H01J 2237/334* (2013.01)

(58) Field of Classification Search
CPC ......... H01L 21/31116; H01L 21/31138; H01L 21/67069; H01L 21/67103; H01L 21/67109; H01L 21/67248; H01L 21/6831; H01L 21/6833; H01L 22/26; H02N 13/00

See application file for complete search history.

(56) References Cited

U.S. PATENT DOCUMENTS

| | | | |
|---|---|---|---|
| 5,796,074 A | 8/1998 | Edelstein et al. | |
| 5,880,923 A | 3/1999 | Hausmann | |
| 6,392,205 B1 | 5/2002 | Minonishi | |
| 6,740,853 B1 | 5/2004 | Johnson et al. | |
| 6,921,724 B2 | 7/2005 | Kamp et al. | |
| 7,071,551 B2 | 7/2006 | Hiramatsu et al. | |
| 7,110,917 B2 | 9/2006 | Matsuura et al. | |
| 7,417,206 B2 | 8/2008 | Nakamura | |
| 8,071,916 B2 | 12/2011 | Iwata et al. | |
| 8,075,733 B2 | 12/2011 | Watanabe et al. | |
| 8,092,602 B2 | 1/2012 | Fink et al. | |
| 8,404,572 B2 | 3/2013 | Chang et al. | |
| 8,405,005 B2 | 3/2013 | Zucker et al. | |
| 8,904,957 B2 | 12/2014 | Kikuchi et al. | |
| 8,971,009 B2 | 3/2015 | Parkhe et al. | |
| 10,026,631 B2 * | 7/2018 | Oohashi | H01J 37/32082 |
| 2002/0050246 A1 | 5/2002 | Parkhe | |
| 2002/0177094 A1 | 11/2002 | Shirakawa | |
| 2002/0196596 A1 | 12/2002 | Parkhe et al. | |
| 2003/0186183 A1 | 10/2003 | Ito et al. | |
| 2004/0175549 A1 | 9/2004 | Ito | |
| 2004/0177927 A1 | 9/2004 | Kikuchi et al. | |
| 2005/0022932 A1 | 2/2005 | Kagoshima et al. | |
| 2005/0090914 A1 | 4/2005 | Tanaka et al. | |
| 2006/0076109 A1 | 4/2006 | Holland et al. | |
| 2006/0207725 A1 | 9/2006 | Oohashi et al. | |
| 2006/0289447 A1 | 12/2006 | Mohamed | |
| 2007/0082311 A1 | 4/2007 | Yamaguchi et al. | |
| 2008/0017104 A1 | 1/2008 | Matyushkin et al. | |
| 2008/0066676 A1 | 3/2008 | Mariner et al. | |
| 2008/0102412 A1 | 5/2008 | Weichert et al. | |
| 2008/0170969 A1 | 7/2008 | Yoshioka et al. | |
| 2008/0228308 A1 | 9/2008 | Phelps | |
| 2008/0280451 A1 | 11/2008 | Ohmoto et al. | |
| 2009/0095095 A1 | 4/2009 | Hayashi | |
| 2009/0095733 A1 | 4/2009 | Komatsu | |
| 2009/0118872 A1 | 5/2009 | Nonaka et al. | |
| 2009/0177310 A1 | 7/2009 | Dao et al. | |
| 2009/0277883 A1 | 11/2009 | Tandou et al. | |
| 2009/0277895 A1 | 11/2009 | Komatsu et al. | |
| 2009/0310645 A1 | 12/2009 | Kofuji et al. | |
| 2010/0163188 A1 | 7/2010 | Tanaka et al. | |
| 2010/0218895 A1 | 9/2010 | Tezuka | |
| 2010/0279512 A1 | 11/2010 | Udea et al. | |
| 2010/0300622 A1 | 12/2010 | Yatsuda et al. | |
| 2010/0323313 A1 | 12/2010 | Toriya et al. | |
| 2011/0066294 A1 | 3/2011 | Takechi et al. | |
| 2011/0092072 A1 | 4/2011 | Singh et al. | |
| 2011/0174778 A1 | 7/2011 | Sawada et al. | |
| 2011/0220288 A1 | 9/2011 | Kobayashi et al. | |
| 2011/0303641 A1 | 12/2011 | Mahadeswaraswamy et al. | |
| 2012/0012556 A1 | 1/2012 | Matsumoto et al. | |
| 2012/0031889 A1 | 2/2012 | Komatsu | |
| 2012/0091108 A1 | 4/2012 | Lin et al. | |
| 2012/0132397 A1 | 5/2012 | Silveira et al. | |
| 2012/0227955 A1 | 9/2012 | Koshimizu | |
| 2012/0248067 A1 | 10/2012 | Ogi et al. | |
| 2012/0292305 A1 * | 11/2012 | Ambal | H01L 21/67103 219/520 |
| 2013/0016346 A1 | 1/2013 | Romanovsky et al. | |
| 2013/0062839 A1 | 3/2013 | Tschinderle et al. | |
| 2013/0105084 A1 | 5/2013 | Mahadeswaraswamy | |
| 2013/0117986 A1 | 5/2013 | Chhatre et al. | |
| 2013/0161305 A1 | 6/2013 | Ptasienski et al. | |
| 2013/0224675 A1 | 8/2013 | Park | |
| 2014/0097176 A1 | 4/2014 | Bobgan et al. | |
| 2014/0129045 A1 | 5/2014 | Kawai et al. | |
| 2014/0234992 A1 * | 8/2014 | Kubota | H01L 21/76811 438/9 |
| 2014/0253900 A1 | 9/2014 | Cornelissen et al. | |
| 2014/0262199 A1 * | 9/2014 | Kobayashi | G05D 23/1934 165/294 |
| 2015/0214653 A1 * | 7/2015 | Sakane | H01R 13/53 439/190 |
| 2015/0226611 A1 | 8/2015 | Busche et al. | |
| 2015/0228513 A1 * | 8/2015 | Parkhe | H01L 21/67103 219/444.1 |
| 2015/0340255 A1 | 11/2015 | Parkhe et al. | |
| 2016/0345384 A1 | 11/2016 | Zhang et al. | |
| 2017/0140957 A1 * | 5/2017 | Kitagawa | H01J 37/32009 |
| 2017/0140958 A1 * | 5/2017 | Kitagawa | H01L 21/67069 |
| 2017/0162407 A1 | 6/2017 | Swanson et al. | |
| 2017/0372928 A1 * | 12/2017 | Yamada | C23C 16/46 |
| 2018/0301362 A1 * | 10/2018 | Oohashi | H01J 37/32082 |
| 2019/0103255 A1 * | 4/2019 | Chung | H01L 21/67109 |

FOREIGN PATENT DOCUMENTS

| | | |
|---|---|---|
| JP | 2009-054871 | 3/2009 |
| JP | 2009-141034 | 6/2009 |
| JP | 2016-189425 | 11/2016 |
| KR | 10-2008-0089463 | 10/2008 |
| KR | 10-2011-0048547 | 5/2011 |
| WO | 2010/053173 | 5/2010 |

\* cited by examiner

FIG.14
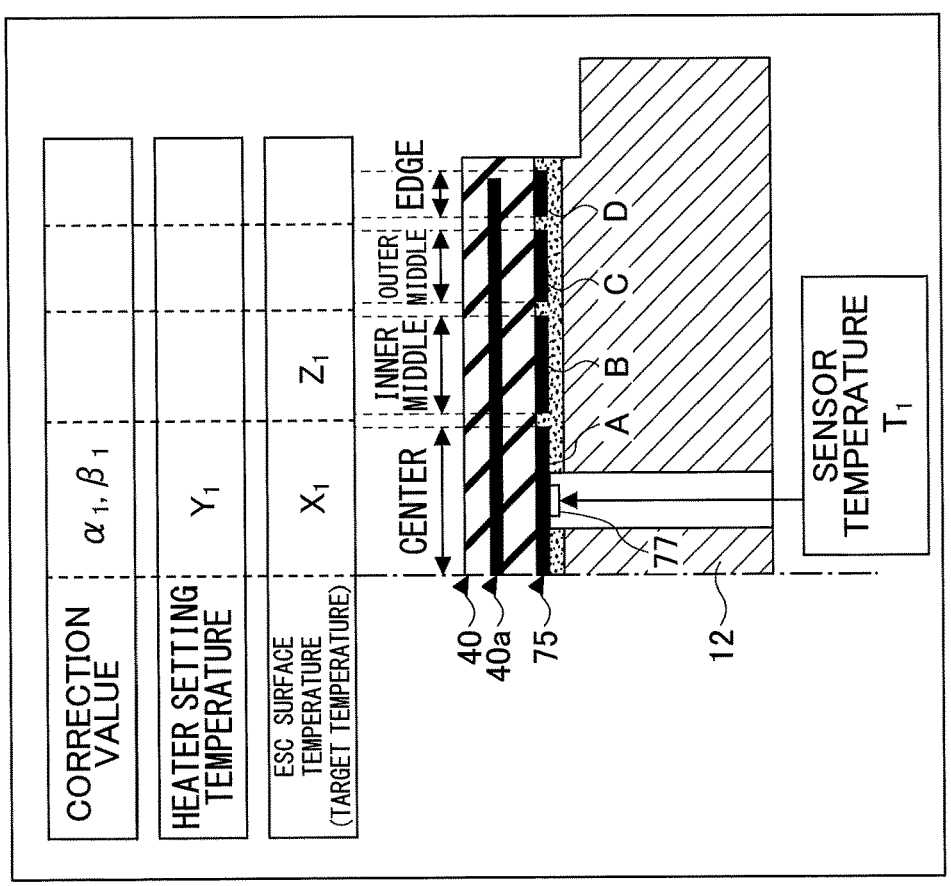
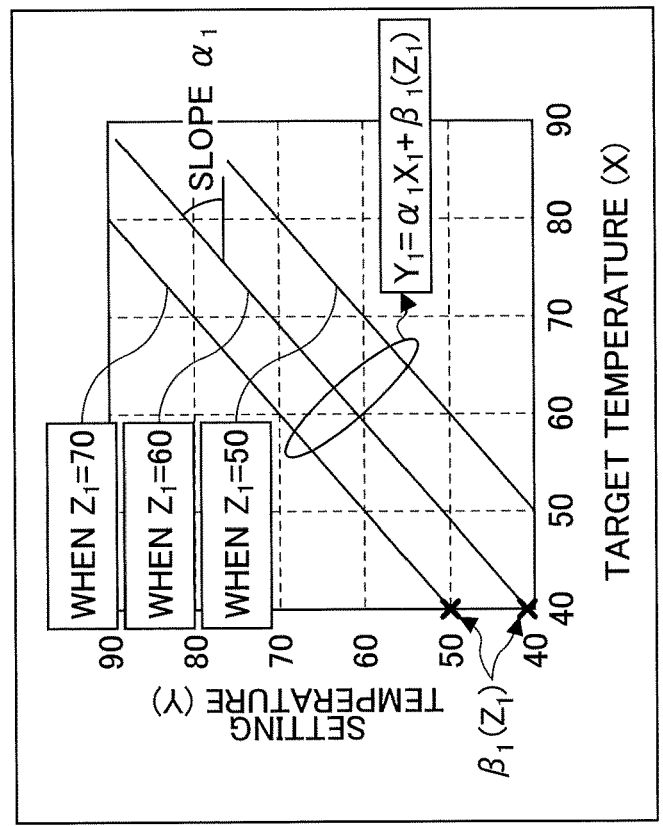

FIG.15
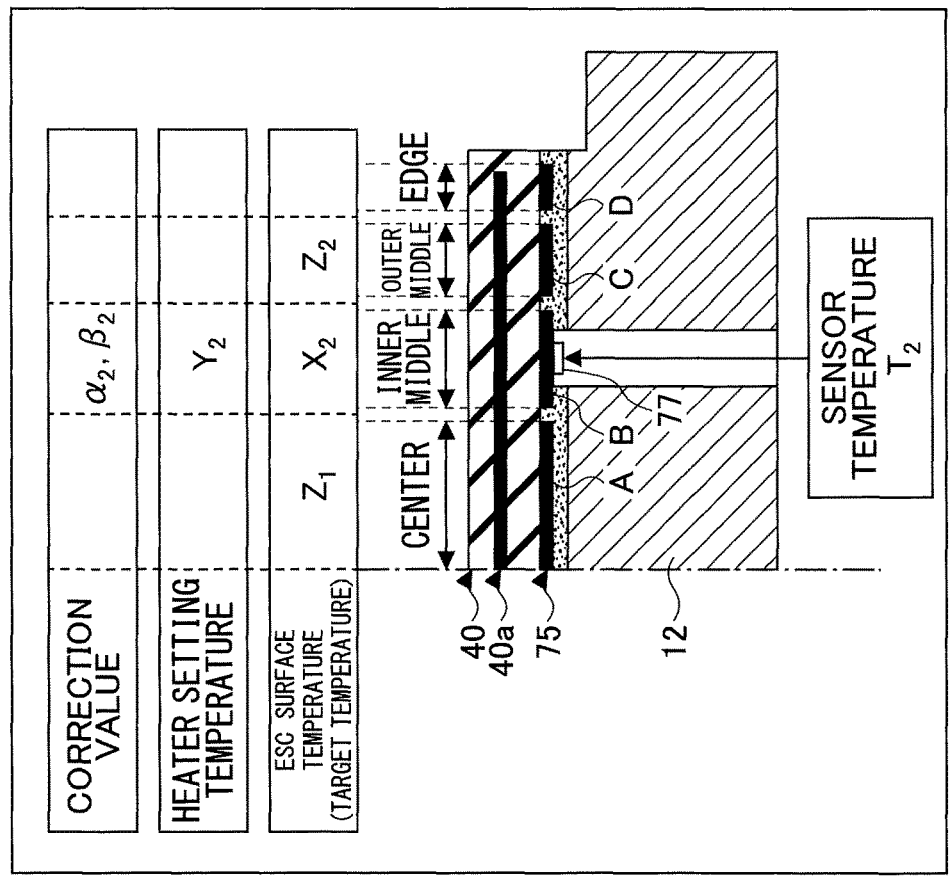
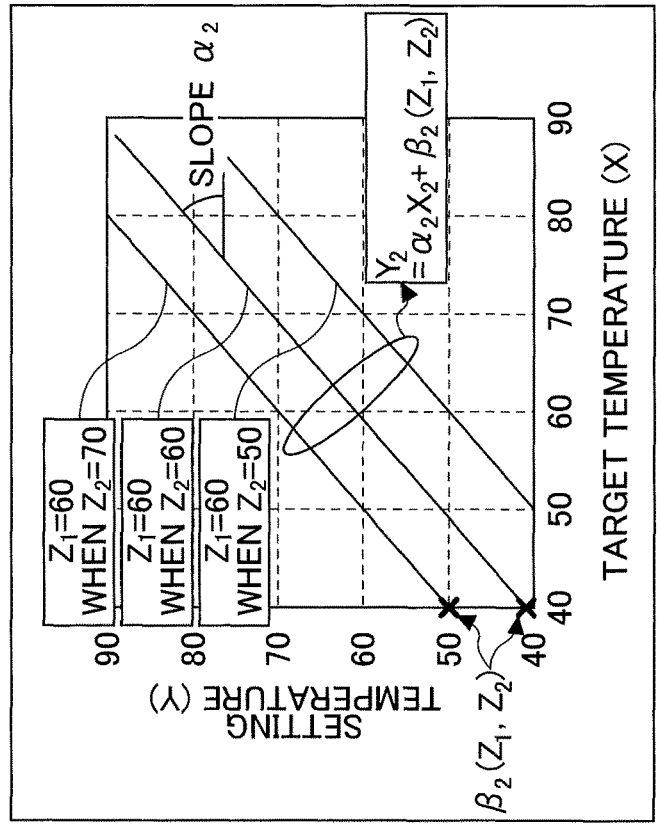

FIG.16
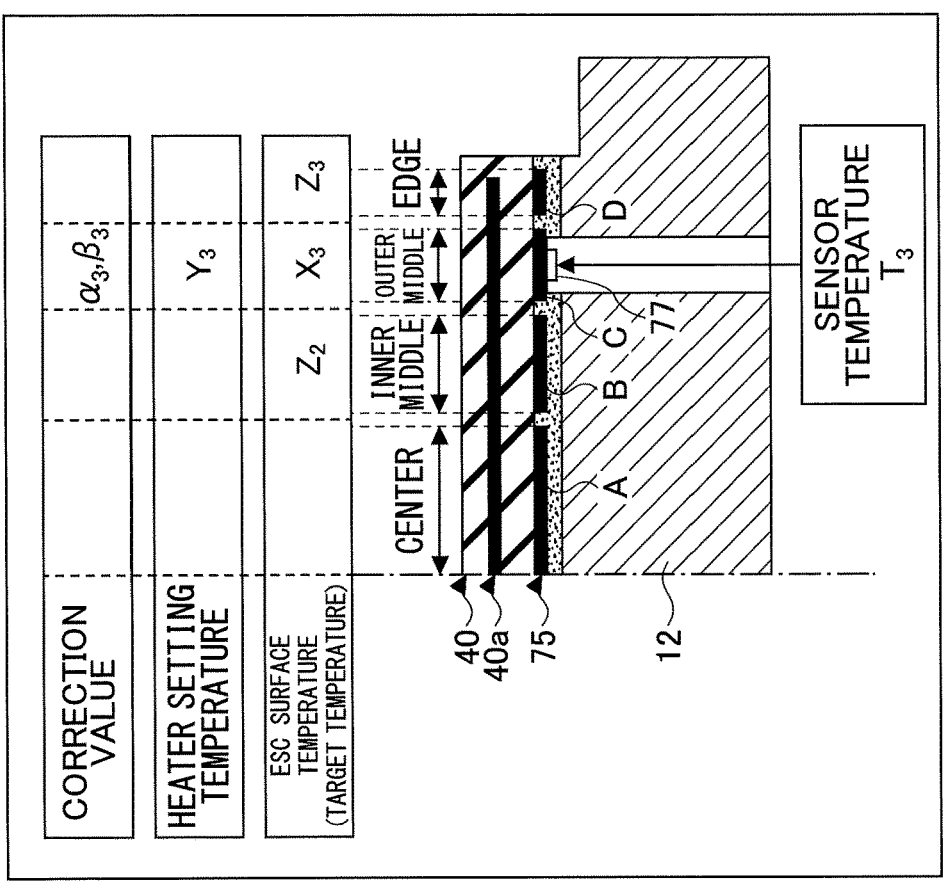
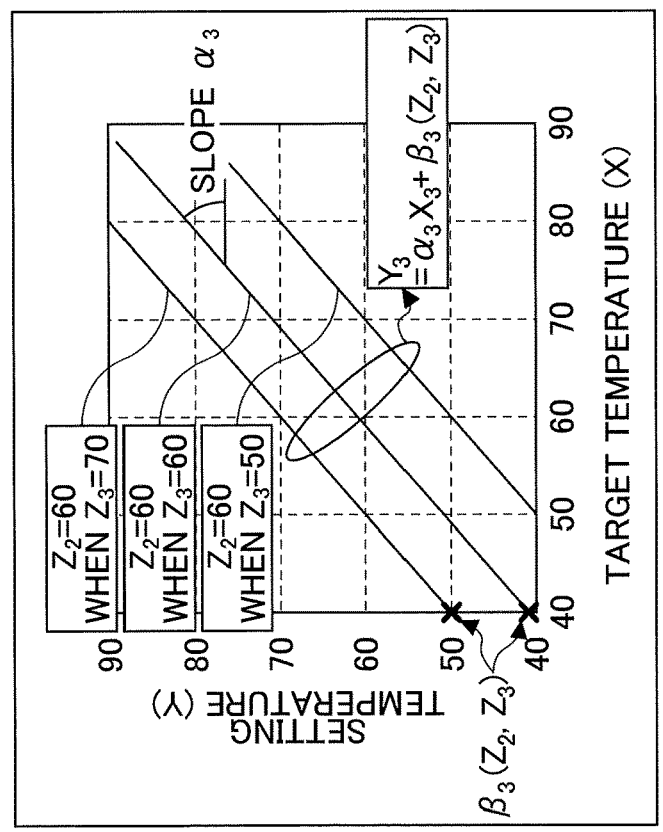

FIG.17
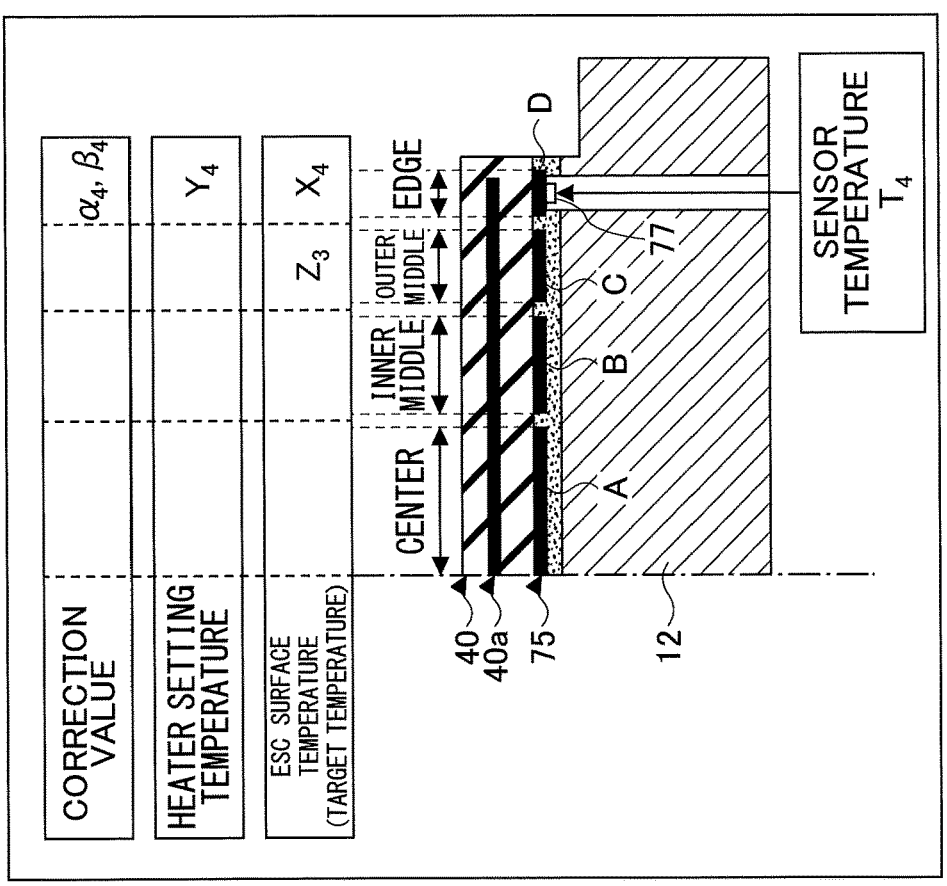
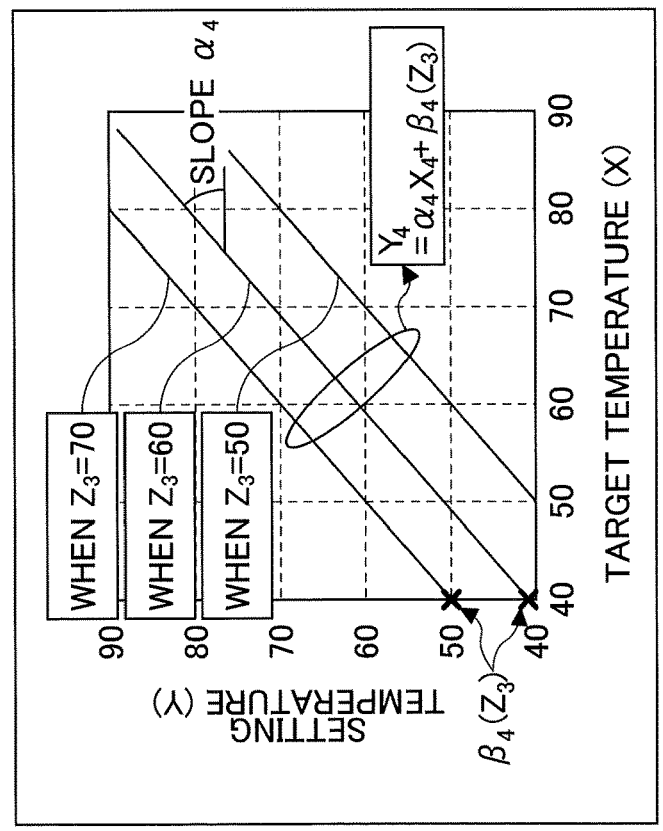

PLASMA PROCESSING APPARATUS AND HEATER TEMPERATURE CONTROL METHOD

CROSS-REFERENCE TO RELATED APPLICATION

The present application is a continuation application and claims priority under 35 U.S.C. 120 to U.S. patent application Ser. No. 15/428,313, filed on Feb. 9, 2017, which is a divisional application of U.S. patent application Ser. No. 14/368,548, filed on Jun. 25, 2014, which is the National Stage of International Application No. PCT/JP2013/050195, filed on Jan. 9, 2013, which claims priority under 35 U.S.C. 119 to Japanese Patent Application No. 2012-005590, filed on Jan. 13, 2012 and U.S. Patent Application No. 61/587,706, filed on Jan. 18, 2012. The entire contents of the foregoing applications are incorporated herein by reference.

TECHNICAL FIELD

The present invention relates to a plasma processing apparatus and a heater temperature control method.

BACKGROUND ART

Temperature control of a workpiece placed on a mounting table is indispensable for controlling an etching rate, for example. Temperature control affects the uniformity of a plasma process performed on the workpiece and is therefore an important aspect of the plasma process.

An electrostatic chuck (ESC) that electrostatically attracts the workpiece by applying a voltage to a chuck electrode is arranged on the mounting table. In recent years, heater embedded electrostatic chuck mechanisms have been proposed that have heaters embedded within the electrostatic chuck such that the surface temperature of the electrostatic chuck may be rapidly changed through heat generation by the heaters. For example, Patent Document 1 discloses a temperature control technique implemented by a heater embedded electrostatic chuck mechanism. According to Patent Document 1, heaters arranged in the heater embedded electrostatic chuck mechanism are divided into two zones including a circular center zone and an edge zone that is concentrically arranged around the outer periphery of the center zone, and temperature control is implemented with respect to each of these zones.

PRIOR ART DOCUMENTS

Patent Documents

Patent Document 1: Japanese Laid-Open Patent Publication No. 2008-85329

SUMMARY OF THE INVENTION

Problem to be Solved by the Invention

However, in the above temperature control method that divides heaters into two zones, the heater area of one zone is still relatively large such that unevenness may be created in the temperature distribution within the same zone even when temperature control is implemented with respect to each zone. As a result, uniformity in the etching rate and the etching shape may not be achieved. Etching characteristics are particularly degraded at a boundary portion between the center zone and the edge zone.

In light of the above, one aspect of the present invention relates to providing a method for controlling a temperature of a heater arranged in a plasma processing apparatus in which the heater arranged within or near an electrostatic chuck is divided into a plurality of heater zones and temperature control is implemented with respect to each of these heater zones.

Means for Solving the Problem

According to one embodiment of the present invention, a method is provided for controlling a temperature of a heater arranged in a plasma processing apparatus that is configured to convert a gas into plasma using a high frequency power and perform a plasma process on a workpiece with the plasma. The plasma processing apparatus includes a processing chamber that can be depressurized, a mounting table that is arranged within the processing chamber and is configured to hold the workpiece, an electrostatic chuck that is arranged on the mounting table and is configured to electrostatically attract the workpiece by applying a voltage to a chuck electrode, and a heater that is arranged within or near the electrostatic chuck and is divided into a plurality of heater zones. The temperature control method includes adjusting a control temperature of the heater with respect to each of the plurality of heater zones, and correcting a temperature interference from an adjacent heater zone of each of the heater zones with respect to a setting temperature of each of the heater zones upon adjusting the control temperature of the heater with respect to each of the heater zones.

Advantageous Effect of the Invention

According to an aspect of the present invention, a heater arranged within or near an electrostatic chuck may be divided into a plurality of heater zones and temperature control may be implemented with respect to each of these heater zones.

BRIEF DESCRIPTION OF THE DRAWINGS

FIG. 14 illustrates a method of calculating correction values $\alpha_1$ and $\beta_1$ with respect to a heater setting temperature $Y_1$ according to an embodiment of the present invention;

FIG. 15 illustrates a method of calculating correction values $\alpha_2$ and $\beta_2$ with respect to a heater setting temperature $Y_2$ according to an embodiment of the present invention;

FIG. 16 illustrates a method of calculating correction values $\alpha_3$ and $\beta_3$ with respect to a heater setting temperature $Y_3$ according to an embodiment of the present invention;

FIG. 17 illustrates a method of calculating correction values $\alpha_4$ and $\beta_4$ with respect to a heater setting temperature $Y_4$ according to an embodiment of the present invention;

EMBODIMENTS FOR IMPLEMENTING THE INVENTION

Figure 1:
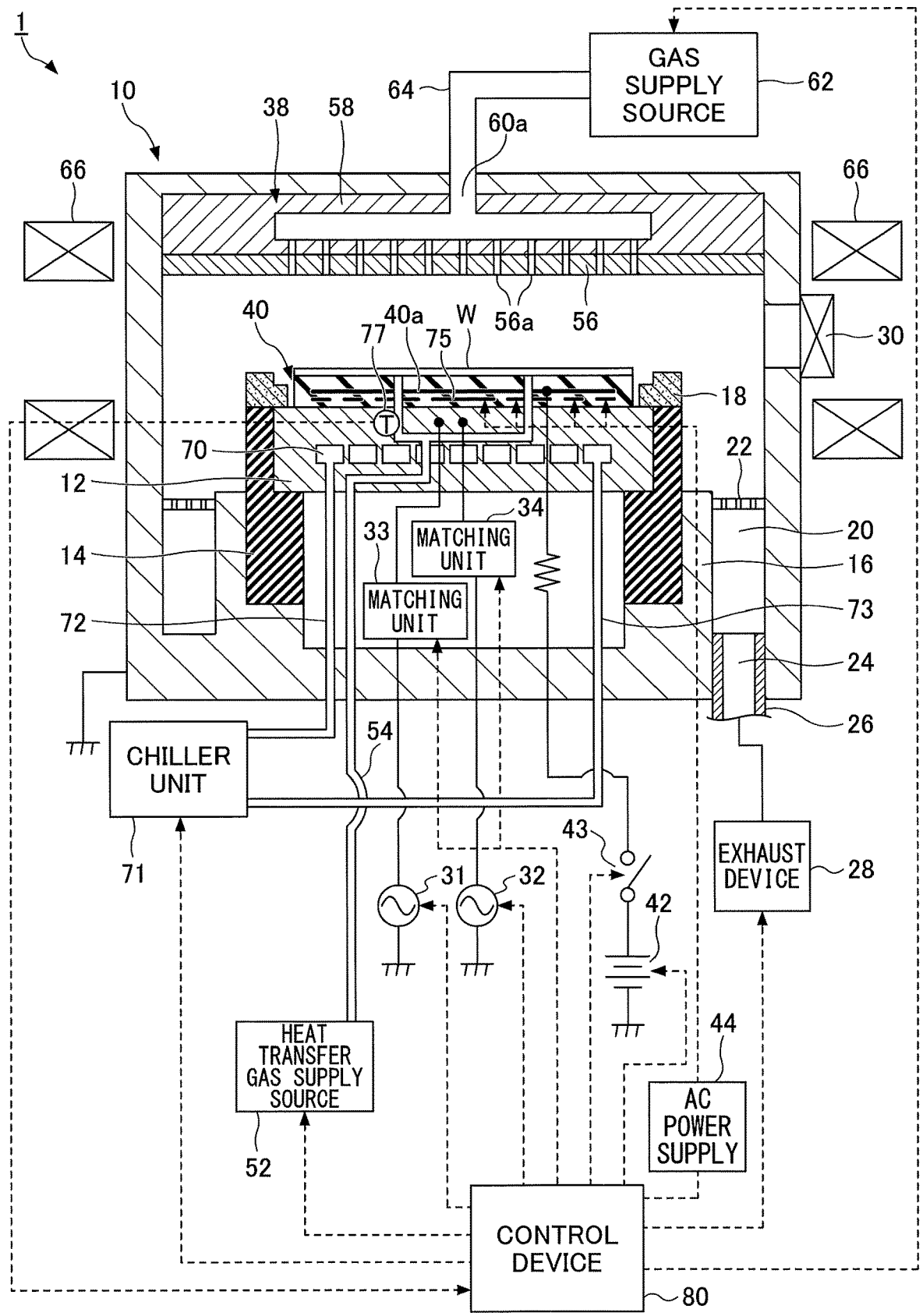
FIG. 1 illustrates an overall configuration of a plasma processing apparatus according to an embodiment of the present invention.

In the following, embodiments of the present invention are described with reference to the accompanying drawings. Note that elements having substantially the same functions or features may be given the same reference numerals and overlapping descriptions thereof may be omitted.

[Overall Configuration of Plasma Processing Apparatus]

First, an overall configuration of a plasma processing apparatus according to an embodiment of the present invention is described with reference to FIG. 1. The plasma processing apparatus 1 illustrated in FIG. 1 is configured as a dual frequency capacitively coupled plasma etching apparatus. The plasma processing apparatus 1 includes a cylindrical vacuum chamber (processing chamber) 10 (simply referred to as "chamber" hereinafter) made of aluminum having an alumite-treated (anodized) surface, for example. The chamber 10 may be grounded, for example.

A mounting table 12 configured to hold a semiconductor wafer W (hereinafter, simply referred to as a "wafer W") thereon as a workpiece is arranged within the chamber 10. The mounting table 12 may be made of aluminum, for example, and is supported on a cylindrical support 16 via an insulating cylindrical holder 14. The cylindrical support 16 extends vertically upward from a bottom of the chamber 10. To improve in-plane etching uniformity, a focus ring 18 that may be made of silicon, for example, is arranged on a top surface of the mounting table 12 to surround the outer edge of an electrostatic chuck 40.

An exhaust path 20 is formed between a sidewall of the chamber 10 and the cylindrical support 16. A ring-shaped baffle plate 22 is arranged in the exhaust path 20. An exhaust port 24 is formed at a bottom portion of the exhaust path 20 and is connected to an exhaust device 28 via an exhaust pipe 26. The exhaust device 28 includes a vacuum pump (not shown) and is configured to depressurize a processing space within the chamber 10 to a predetermined vacuum level. A gate valve 30 configured to open/close an entry/exit port for the wafer W is provided at the sidewall of the chamber 10.

A first high frequency power supply 31 for drawing ions and a second high frequency power supply 32 for plasma generation are electrically connected to the mounting table 12 via a matching unit 33 and a matching unit 34, respectively. The first high frequency power supply 31 may be configured to apply to the mounting table 12 a first high frequency power of a relatively low frequency (e.g. 0.8 MHz) that is suitable for drawing ions from within the plasma onto the wafer W placed on the mounting table 12. The second high frequency power supply 32 may be configured to apply to the mounting table 12 a second high frequency power of a higher frequency (e.g. 60 MHz) that is suitable for generating a plasma within the chamber 10. In this way, the mounting table 12 also acts as a lower electrode. Further, a shower head 38, which is described below, is provided at a ceiling portion of the chamber 10. The shower head 38 acts as an upper electrode at a ground potential. In this way, the second high frequency power from the second high frequency power supply 32 is capacitively applied between the mounting table 12 and the shower head 38.

The electrostatic chuck 40 configured to hold the wafer W by an electrostatic attractive force is provided on the top surface of the mounting table 12. The electrostatic chuck 40 includes an electrode 40a that is made of a conductive film and is arranged between a pair of insulating layers 40b (see FIGS. 2-4) or insulating sheets. A DC voltage supply 42 is electrically connected to the electrode 40a via a switch 43. The electrostatic chuck 40 electrostatically attracts and holds the wafer W by a Coulomb force that is generated when a voltage is applied thereto from the DC voltage supply 42.

A heat transfer gas supply source 52 is configured to supply a heat transfer gas such as He gas between the backside surface of the wafer W and the top surface of the electrostatic chuck 40 through a gas supply line 54.

The shower head 38 disposed at the ceiling portion of the chamber 10 includes an electrode plate 56 having multiple gas holes 56a and an electrode supporting body 58 configured to detachably hold the electrode plate 56. A gas supply source 62 supplies gas to the shower head 38 via a gas supply pipe 64, which is connected to a gas inlet 60a. In this way, the gas may be introduced into the chamber 10 from the multiple gas holes 56a.

A magnet 66 is arranged to extend annularly or concentrically around the chamber 10 so that the plasma generated within a plasma generation space of the chamber 10 may be controlled by the magnetic force of the magnet 66.

A coolant path 70 is formed within the mounting table 12. A coolant cooled to a predetermined temperature is supplied to the coolant path 70 from a chiller unit 71 via pipes 72 and 73. Also, a heater 75 that is divided into four zones is attached to the backside surface of the electrostatic chuck 40. Note that the configuration of the heater 75 is described in detail below. A desired AC voltage is applied to the heater 75 from an AC power supply 44. In this way, the temperature of the wafer W may be adjusted to a desired temperature through cooling by the chiller unit 71 and heating by the heater 75. Note that such temperature control may be performed based on a command from a control device 80.

The control device 80 is configured to control the individual components of the plasma processing apparatus 1 such as the exhaust device 28, the AC power supply 44, the DC voltage supply 42, the switch 43 for the electrostatic chuck, the first high frequency power supply 31, the second high frequency power supply 32, the matching units 33 and 34, the heat transfer gas supply source 52, the gas supply source 62, and the chiller unit 71. The control device 80 also acquires a sensor temperature detected by a temperature sensor 77 attached to the backside surface of the heater 75. Note that the control device 80 may be connected to a host computer (not shown).

The control device 80 includes a CPU (Central Processing Unit), a ROM (Read Only Memory), and a RAM (Random Access Memory), which are not shown. The CPU executes a plasma process according to various recipes stored in a storage unit 83 illustrated in FIG. 13, for example. The storage unit 83 storing the recipes may be configured as a RAM or a ROM using a semiconductor memory, a magnetic disk, or an optical disk, for example. The recipes may be stored in a storage medium and loaded in the storage unit 83 via a driver, for example. Alternatively, the recipes may be downloaded from a network (not shown) and stored in the storage unit 83, for example. Also, note that a DSP (digital signal processor) may be used instead of the CPU to perform the above functions. The functions of the control device 80 may be implemented by software, hardware, or a combination thereof.

When performing an etching process using the plasma processing apparatus 1 having the above-described configuration, first, the gate valve 30 is opened, and a wafer W that is held by a transfer arm is loaded into the chamber 10. Then, the wafer W is lifted from the transfer arm by pusher pins (not shown), and the wafer W is placed on the electrostatic chuck 40 when the pusher pins are lowered. After the wafer W is loaded, the gate valve 30 is closed. Then, an etching gas is introduced into the chamber 10 from the gas supply source 62 at a predetermined flow rate and flow rate ratio, and the internal pressure of the chamber 10 is reduced to a predetermined pressure by the exhaust device 28. Further, high frequency powers at predetermined power levels are supplied to the mounting table 12 from the first high frequency power supply 31 and the second high frequency power supply 32. Also, a voltage from the DC voltage supply 42 is applied to the electrode 40a of the electrostatic chuck 40 so that the wafer W may be fixed to the electrostatic chuck 40. A heat transfer gas from the heat transfer gas supply source 52 is supplied between the top surface of the electrostatic chuck 40 and the backside surface of the wafer W. Etching gas sprayed into the chamber 10 from the shower head 38 is excited into a plasma by the first high frequency power from the first high frequency power supply 32. In this way, the plasma is generated within the plasma generation space between the upper electrode (shower head 38) and the lower electrode (mounting table 12), and a main surface of the wafer W is etched by ions and radicals included in the generated plasma. Also, the ions in the plasma may be drawn toward the wafer W by the first high frequency power from the first high frequency power supply 31.

After plasma etching is completed, the wafer W is lifted and held by the pusher pins, the gate valve 30 is opened, and the transfer arm is introduced into the chamber 10. Then, the pusher pins are lowered so that the wafer W may be held by the transfer arm. Then, the transfer arm exits the chamber 10, and a next wafer W is loaded into the chamber 10 by the transfer arm. By repeating the above-described procedures, wafers W may be successively processed.

(Heater Configuration)

Figure 2:
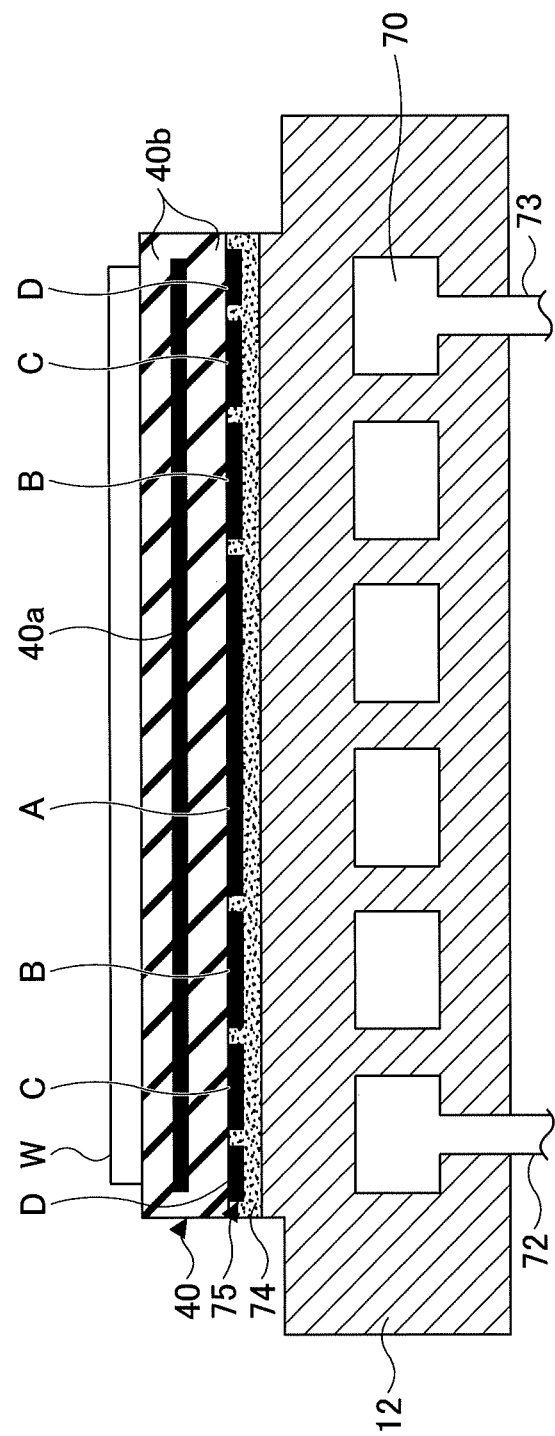
FIG. 2 is an enlarged view of a heater embedded electrostatic chuck mechanism of FIG. 1 including a heater arranged near an electrostatic chuck.

In the following, the configuration of the heater 75 is described in detail with reference to FIG. 2. FIG. 2 is an enlarged view of the mounting table 12 and the electrostatic chuck 40 illustrated in FIG. 1. In FIG. 2, the heater 75 is attached to the backside surface of the electrostatic chuck 40. However, in other embodiments, the heater 75 may be arranged within or near the electrostatic chuck 40. For example, in FIG. 3, the heater 75 is embedded within the insulating layer 40b of the electrostatic chuck 40.

Figure 11:
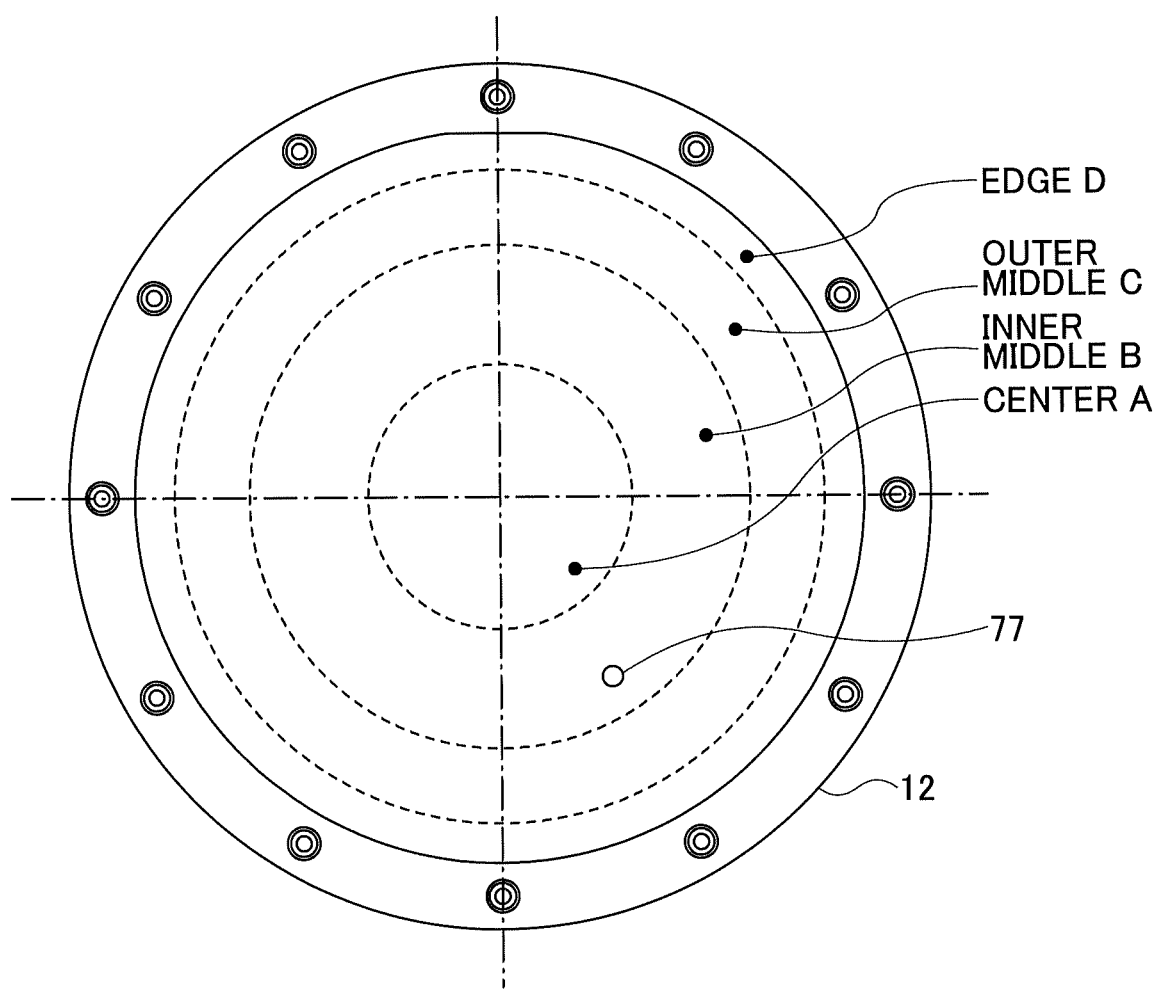
FIG. 11 illustrates an arrangement of the zones of the heater and a temperature sensor according to an embodiment of the present invention.
Figure 12:
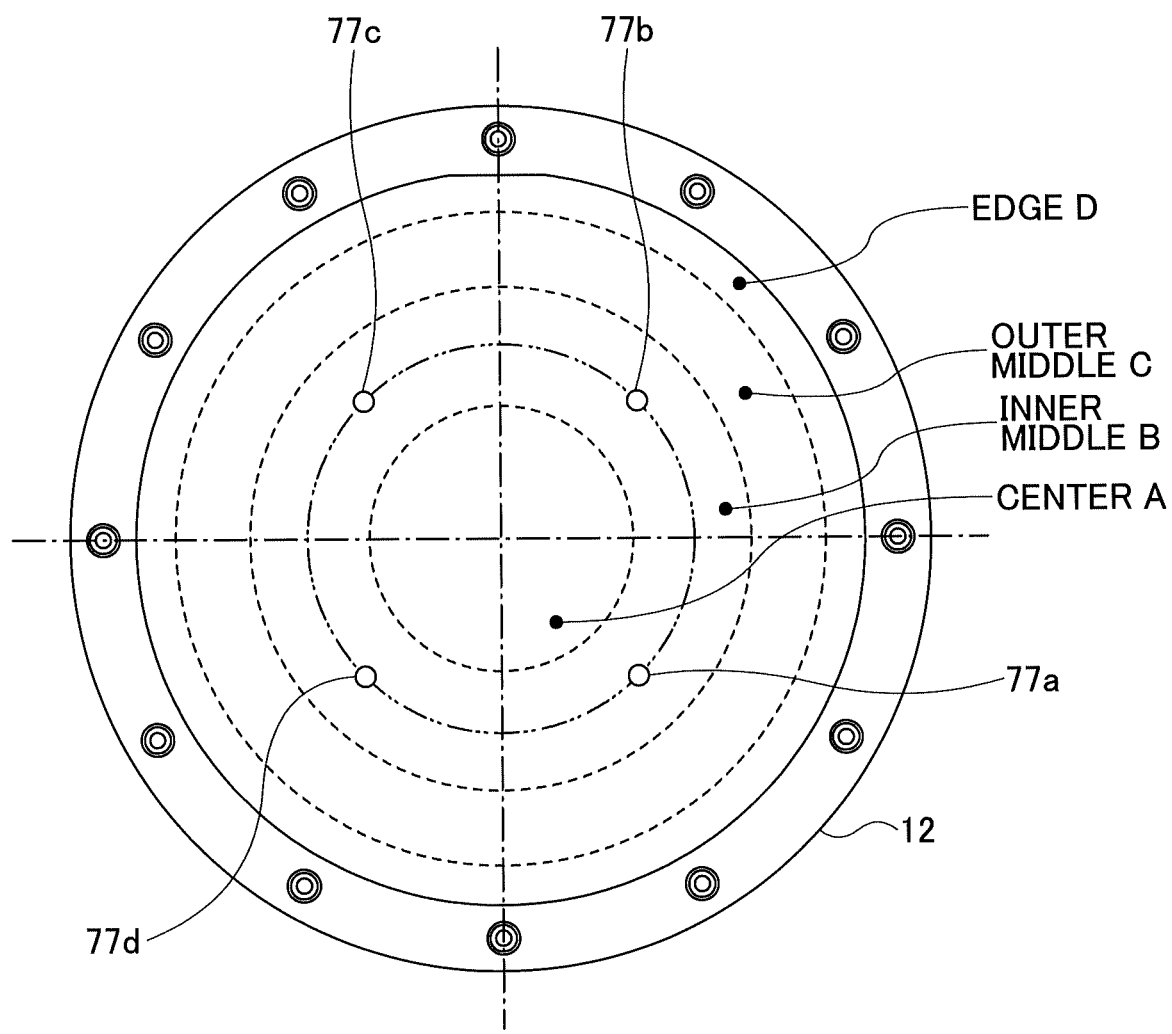
FIG. 12 illustrates another arrangement of the zones of the heater and temperature sensors according to an embodiment of the present invention.

The heater 75 is divided into a circular center zone A, two middle zones (inner middle zone B and outer middle zone C) arranged concentrically around the outer periphery side of the center zone A, and an edge zone D arranged concentrically around the outermost periphery (see FIGS. 11 and 12). Note that although the middle zones are divided into two zones in the present embodiment, the middle zones may also be divided into three or more zones, for example. Particularly, in a case where the diameter of the wafer W is greater than or equal to 450 mm, the middle zones of the heater 75 are preferably divided into at least three zones in order to achieve higher temperature controllability at the middle zones.

The electrostatic chuck 40 and the mounting table 12 may be attached to one another by an adhesive, for example. In this way, the heater 75 attached to the electrostatic chuck 40 may be embedded within an adhesive layer 74 and fixed between the electrostatic chuck 40 and the mounting table 12. In the case where the heater 75 is attached to the backside surface of the electrostatic chuck 40 as illustrated in FIG. 2, the arrangement of the heater 75 (heater pattern) may be freely altered until right before the electrostatic chuck 40 and the mounting table 12 are bound together by the adhesive layer 74. Also, even after the electrostatic chuck 40 and the mounting table 12 are bound together by the adhesive layer 74, the heater pattern may still be altered by detaching the electrostatic chuck 40 and the mounting table 12, altering the heater pattern as desired, reapplying an adhesive on the heater 75, and reattaching the electrostatic chuck 40 and the mounting table 12 together.

Figure 3:
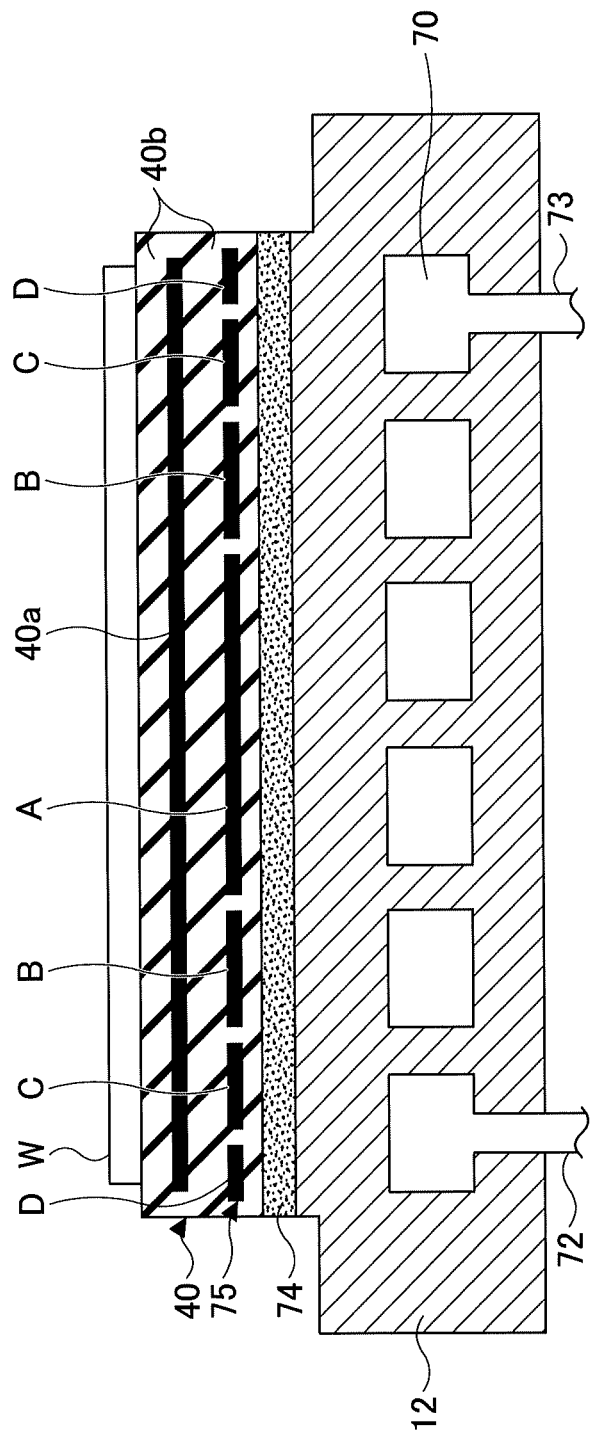
FIG. 3 is an enlarged view of a heater embedded electrostatic chuck mechanism including a heater arranged within an electrostatic chuck according to a first modified embodiment.

On the other hand, in the case where the heater 75 is embedded within the electrostatic chuck 40, the heater 75 is fixed within the insulating layer 40b when the insulating layer 40b is sintered. In this case, the heater pattern may not be altered after the heater 75 is embedded within the insulating layer 40b. Thus, in a case where the heater 75 is divided into four or more zones such that the heater pattern becomes rather complicated as in the present embodiment, a heater configuration enabling easy rearrangement of the heater pattern such as that illustrated in FIG. 2 is preferably used rather than the heater configuration having the heater 75 embedded within the electrostatic chuck 40 as illustrated in FIG. 3.

Also, in the case where the heater 75 is attached to the backside surface of the electrostatic chuck 40 as illustrated in FIG. 2, the heater 75 is embedded in the adhesive layer 74. Note that when the heater 75 is embedded in the insulating layer 40b as illustrated in FIG. 3, the heater 75 may not be arranged near the edge portions of the electrostatic chuck 40 because thin ceramic portions of the insulating layer 40b may break when the insulating layer 40b is sintered. However, such constraints are not imposed on the heater 75 that is embedded in the adhesive layer 74 as illustrated in FIG. 2. Thus, the heater 75 may be arranged to extend near the edge portions of the electrostatic chuck 40 in FIG. 2. As a result, the temperature of the electrostatic chuck 40 may be uniformly controlled up to its outermost edge portions in the heater configuration of FIG. 2 where the heater 75 is attached to the backside surface of the electrostatic chuck 40.

Figure 4:
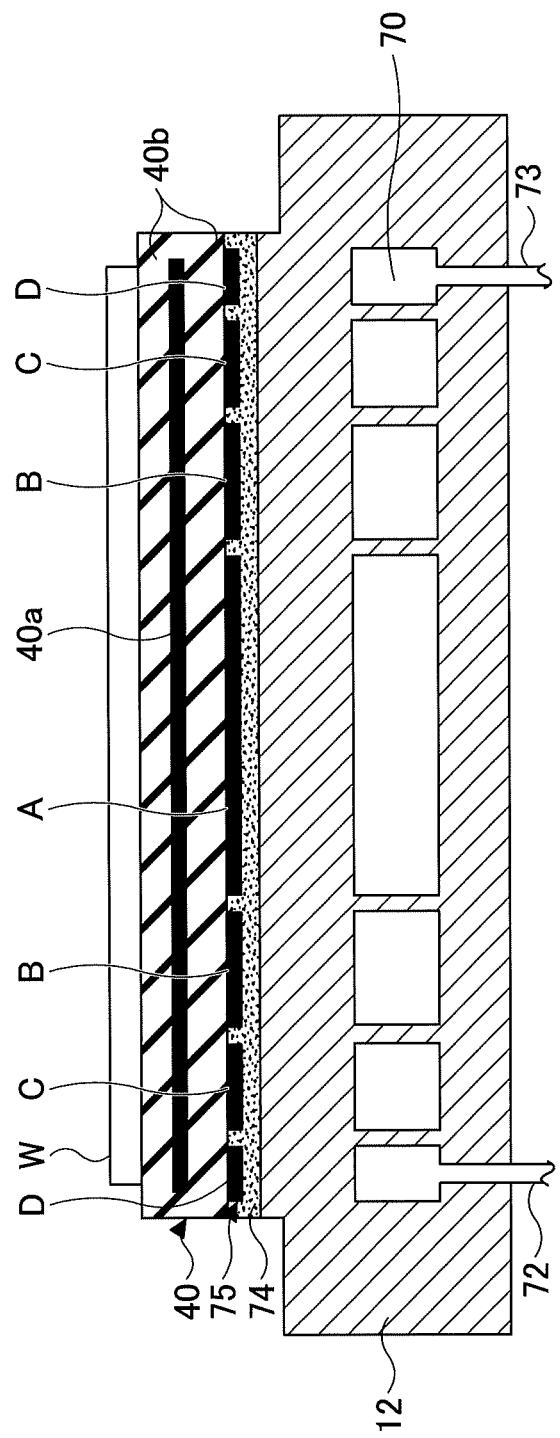
FIG. 4 is an enlarged view of a heater embedded electrostatic chuck mechanism including a heater arranged near an electrostatic chuck according to a second modified embodiment.

Note that in some embodiments, the coolant path 70 arranged opposite the heater 75 may be arranged into a pattern corresponding to the zones of the heater 75 as illustrated in FIG. 4, for example. In this way, temperature controllability and responsiveness may be improved by the cooling by the coolant flowing in the coolant path 70 arranged according to the zones of the heater 75 and heating by the heater 75.

(Plasma Process)

The configurations of the plasma apparatus 1 and the heater 75 according to the present embodiment have been described above. In the following, an exemplary plasma process that may be implemented by the plasma processing apparatus 1 according to the present embodiment are described with reference to FIG. 5.

Figure 5:
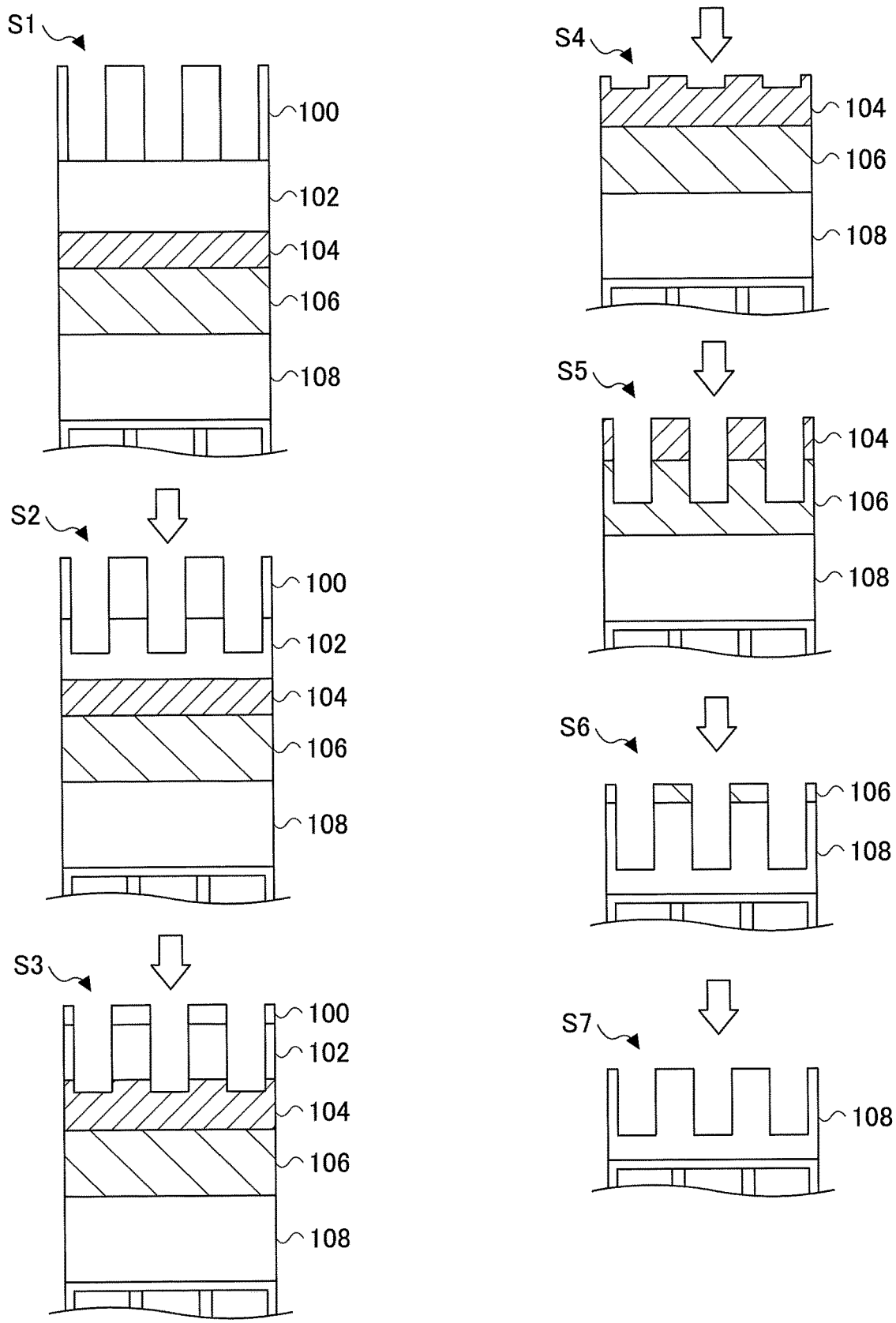
FIG. 5 illustrates exemplary process steps that may be performed by the plasma processing apparatus according to an embodiment of the present invention.

FIG. 5 illustrates exemplary process steps of the plasma process that may be implemented by the plasma processing apparatus 1 of the present embodiment. Note that in the following description of the process steps, setting temperatures of a heater divided into two zones (center/edge) corresponding to a comparison example are indicated as exemplary heater temperature control conditions corresponding to one of the process conditions of the plasma process.

In S1 of FIG. 5, a silicon oxide ($SiO_2$) film 108 having a silicon nitride (SiN) film 106, an amorphous silicon ($\alpha$-Si) film 104, an anti-reflection (BARC: bottom anti-reflective coating) film 102, and a photoresist film 100 stacked thereon in this order is illustrated. The silicon oxide film 108 corresponds to an interlayer insulating film formed by CVD (chemical vapor deposition) using TEOS (tetraethoxysilane).

The BARC (anti-reflection) film 102 may be formed on the amorphous silicon ($\alpha$-Si) film 104 by a coating process, for example. The BARC film 102 is made of a polymer resin containing a pigment that absorbs light having a specific wavelength such as ArF excimer laser light that is irradiated toward the photoresist film 100, for example. The BARC film 102 prevents the ArF excimer laser light that has passed through the photoresist film 100 from being reflected back to the photoresist film 100 by the amorphous silicon film 104. The photoresist film 100 may be formed on the BARC film 102 using a spin coater (not shown), for example. The photoresist film 100 has a pattern (resist pattern) formed thereon including openings arranged at positions where predetermined holes are to be formed.

Referring to S2 of FIG. 5, first, the BARC film 102 is etched using the photoresist film 100 as a mask. In this way, the openings of the resist pattern are transferred to the BARC film 102. As process conditions for this process step, a pressure of 5 (mTorr) is prescribed, the second high frequency power/first high frequency power are prescribed to be 200/50 (W), a gas containing $CF_4/O_2$ is prescribed, and setting temperatures of the heater are prescribed to be center/edge=60/50° C.

Next, referring to S3 of FIG. 5, the amorphous silicon film 104 is etched using the photoresist film 100 and the BARC film 102 as masks. In this way, the pattern of the BARC film 102 may be transferred to the amorphous silicon film 104. As process conditions for this process step, a pressure of 25 (mTorr) is prescribed, the second high frequency power/first high frequency power are prescribed to be 200/100 (W), a gas containing HBr is prescribed, and setting temperatures of the heater are prescribed to be center/edge=50/40° C.

Next, referring to S4 of FIG. 5, $O_2$ ashing is performed and the photoresist film 100 and the BARC film 102 are removed. As process conditions for this process step, a pressure of 50 (mTorr) is prescribed, the second high frequency power/first high frequency power are prescribed to be 750/0 (W), a gas containing $O_2$ is prescribed, and setting temperatures of the heater are prescribed to be center/edge=50/40° C.

Next, referring to S5 of FIG. 5, the silicon nitride film 106 is etched using the amorphous silicon film 104 as a mask (main etching). In this way, the pattern of the amorphous silicon film 104 may be transferred to the silicon nitride film 106. As process conditions for this process step, a pressure of 20 (mTorr) is prescribed, the second high frequency power/first high frequency power are prescribed to be 400/300 (W), a gas containing $CH_2F_2/CH_3F/O_2$ is prescribed, and setting temperatures of the heater are prescribed to be center/edge=35/35° C.

Next, referring to S6 of FIG. 5, the silicon oxide film 108 is etched using the amorphous silicon film 104 and the silicon nitride film 106 as masks (over etching). Note that a portion of the silicon nitride film 106 remains on the silicon oxide film 108 when this process step is performed. As process conditions for this process step, a pressure of 20 (mTorr) is prescribed, the second high frequency power/first high frequency power are prescribed to be 400/300 (W), a gas containing $CH_2F_2/CH_3F/O_2$ is prescribed, and setting temperatures of the heater are prescribed to be center/edge=35/35° C.

Lastly, referring to S7 of FIG. 5, the silicon nitride film 106 is completely removed (breakthrough etching). As process conditions for this process step, a pressure of 10 (mTorr) is prescribed, the second high frequency power/first high frequency power are prescribed to be 200/150 (W), a gas containing $Cl_2$ is prescribed, and setting temperatures of the heater are prescribed to be center/edge=35/35° C. Also, $O_2$ ashing is performed after the breakthrough etching step. In this way, deposited matter may be removed. As process conditions for this process step, a pressure of 50 (mTorr) is prescribed, the second high frequency power/first high frequency power are prescribed to be 750/0 (W), a gas containing $O_2$ is prescribed, and setting temperatures of the heater are prescribed to be center/edge=35/35° C.

By performing the above process steps, the resist pattern may be successively transferred to a lower layer film, and holes having a predetermined opening width may ultimately be formed in the silicon oxide film 108.

(CD Measurement Results: Two Zones)

Figure 6:
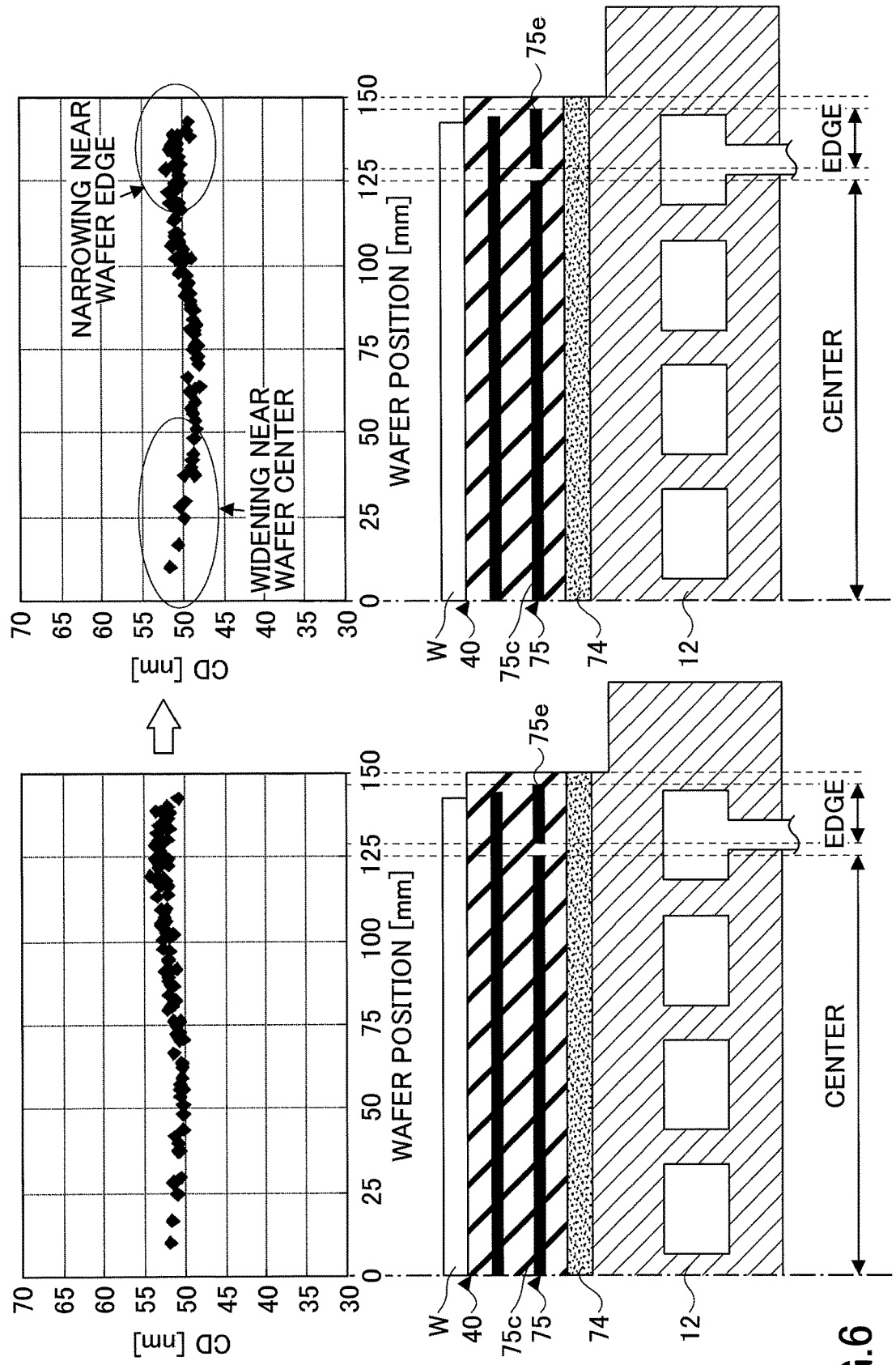
FIG. 6 illustrates process results of implementing temperature control when a heater is divided into two zones.

FIG. 6 illustrates deviations in the diameters (hereinafter referred to as "CD", which stands for critical dimension) of holes formed on the wafer W by the above process steps. FIG. 6 illustrates the deviations in the CD measurements of the holes in a radial direction from the wafer center side to the wafer periphery side. The CD measurements were made at four different measurement points arranged 90 degrees apart from each other along a circumferential direction, and such CD measurements were made with respect to multiple wafer positions along the radial direction from the wafer center side to the wafer periphery side. FIG. 6 represents the result of superposing the above measurement points along a single axis.

The horizontal axis of FIG. 6 represents a radial position of the wafer with respect to the wafer center, and the vertical axis of FIG. 6 represents the CD of the holes formed at various positions. The graph on the left side of FIG. 6 represents CD measurements of the holes formed on the amorphous silicon film 104 after the etching step for etching the amorphous silicon film 104 illustrated by S3 of FIG. 5 has been performed. The graph on the right side of FIG. 6 represents CD measurements of the holes formed on the silicon oxide film 108 after all the process steps up to S7 of FIG. 5 have been performed. Note that in FIG. 6, the heater 75 is divided into a center zone and an edge zone at a position approximately 130 (mm) from the wafer center.

As can be appreciated from the left side graph of FIG. 6, even at the stage of etching the amorphous silicon film 104, variations in the CD of the holes in the radial direction already occur at a maximum variation range of approximately 5 (nm). Such CD variations may be attributed to deviations in the etching rate resulting from a failure to achieve temperature control uniformity across the radial direction from the wafer center to the wafer periphery.

As can be appreciated from the right side graph of FIG. 6, the deviations in the CD of the holes become even wider after all the process steps of FIG. 5 are performed. Particularly, it can be appreciated that the CD of the holes become larger near the wafer center (widening near wafer center) and the CD of the holes become smaller near the wafer edge (narrowing near wafer edge) owing to an inadequacy in the implementation of temperature control. The anomaly (irregularity) in the CD around the wafer center may be attributed to plasma, particularly radicals, existing at a higher density above the wafer center region. The anomaly (irregularity) in the CD around the wafer edge may be attributed to a tendency for heat to be trapped within the wafer edge region and prevented from escaping outside.

Based on the above results, in the present embodiment, a region around the wafer center and a region around the wafer edge where uniform temperature control is particularly difficult are handled as anomalies, and the heater 75 is divided into a plurality of zones such that temperature control may be separately implemented on a center zone A and an edge zone D. Further, it can be appreciated from the process results illustrated in FIG. 6 that the CD becomes gradually greater toward the outer periphery side even within a middle region between the center zone A and the edge zone D. Thus, in-plane uniformity of the wafer temperature may not be achieved if this middle region is handled as one single zone. Accordingly, in the present embodiment, the middle region is divided into two middle zones (i.e., inner middle zone B and outer middle zone C). That is, in the present embodiment, the heater 75 is divided into four zones. Note, however, that the present invention is not limited to the above embodiment, and the middle region of the heater 75 may be divided into three or more zones such that the heater 75 may be divided into a total of five or more zones.

(Setting Temperatures of Zones)

Figure 7:
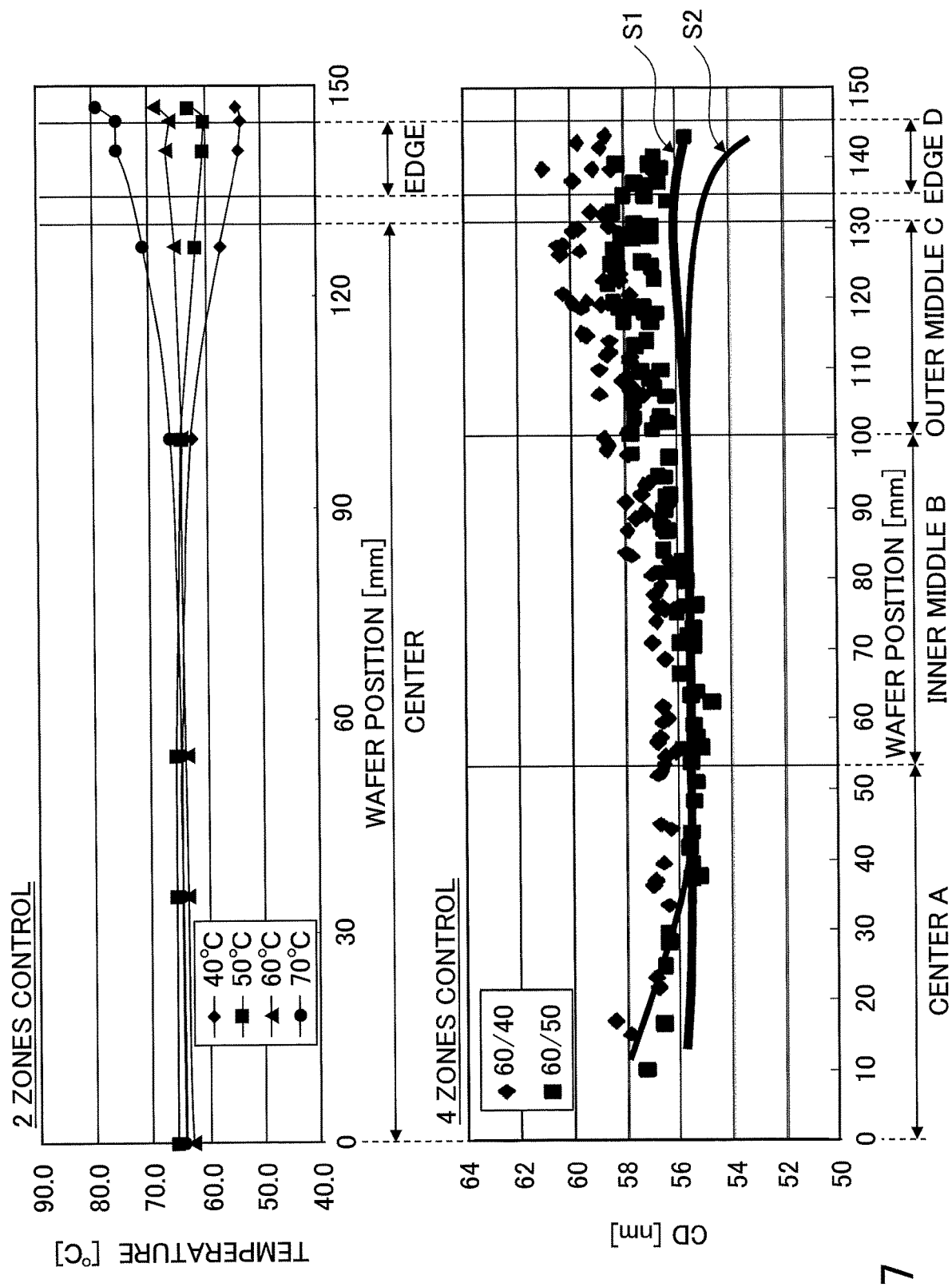
FIG. 7 illustrates process results of implementing temperature control when the heater is divided into two zones and when the heater is divided into four zones.

In the following, setting temperatures of the zones are described with reference to FIG. 7. The top graph of FIG. 7 represents measurement results of the wafer temperature in relation to the heater setting temperature to illustrate in-plane uniformity of the wafer temperature in exemplary cases where temperature control is implemented on the heater 75 that is divided into two zones. That is, the top graph of FIG. 7 represents average values of the wafer temperature in cases where the center zone of the two zones is controlled to a setting temperature of 60° C., and the edge zone of the two zones is controlled to a setting temperature of 40° C., 50° C., 60° C., and 70° C. while plasma processes are performed according to the process steps illustrated in FIG. 5. An increase in the wafer temperature with respect to the setting temperature may be attributed to heat input from plasma. As can be appreciated, in-plane uniformity of the wafer temperature cannot be achieved in any of the above cases. Notably, because the temperature of the middle zone cannot be controlled in the above cases, substantial deviations occur at the outer periphery side of the center zone and the edge zone. Also, in the above cases, the wafer temperature at the wafer edge side increases as the heater setting temperature increases owing to a tendency for heat to be trapped within the wafer edge region and prevented from escaping outside.

In view of the above results, the lower graph of FIG. 7 indicates a curved line S1 representing an estimated relationship between the heater setting temperature and the in-plane uniformity of the wafer temperature in a case where temperature control is implemented on the heater 75 that is divided into four zones. Note that the diamond-shaped dots plotted in the lower graph of FIG. 7 represent CDs of holes famed in a case where the heater 75 is divided into two zones and the center zone and the edge zone are controlled to setting temperatures of 60° C. and 40° C., respectively. The square-shaped dots plotted in the lower graph of FIG. 7 represent CDs of holes formed in a case where the heater 75 is divided into two zones and the center zone and the edge zone are controlled to setting temperatures of 60° C. and 50° C., respectively. In these cases, the CDs at the wafer edge tend to become smaller as the heater setting temperature for the edge zone increases. Further, the CDs at the wafer center side tend to become smaller as the heater setting temperature for the center zone increases. In view of the above, the lower graph of FIG. 7 indicates a curved line S2 representing an estimated relationship between the heater setting temperature and the in-plane uniformity of the wafer temperature in a case where the center zone and the edge zone of the heater 75 that is divided into two zones are controlled to setting temperatures of 60° C. and 60° C., respectively.

In a case where the heater 75 is divided into four zones, and the center zone A, the inner middle zone B, the outer middle zone C, and the edge zone D are controlled to setting temperatures of 70° C., 60° C., 70° C., and 50° C., respectively, for example, improved in-plane uniformity of the wafer temperature may be achieved as illustrated by the curved line S1. That is, in the above case, the setting temperatures for the center zone A and the outer middle zone C are set at a higher temperature of 70° C. compared to the setting temperature 60° C. for the inner middle zone B. In this way, a decrease in CD deviations and improved in-plane uniformity of the wafer temperature may be expected.

(CD Measurement Results: 4 Zones)

Figure 8:
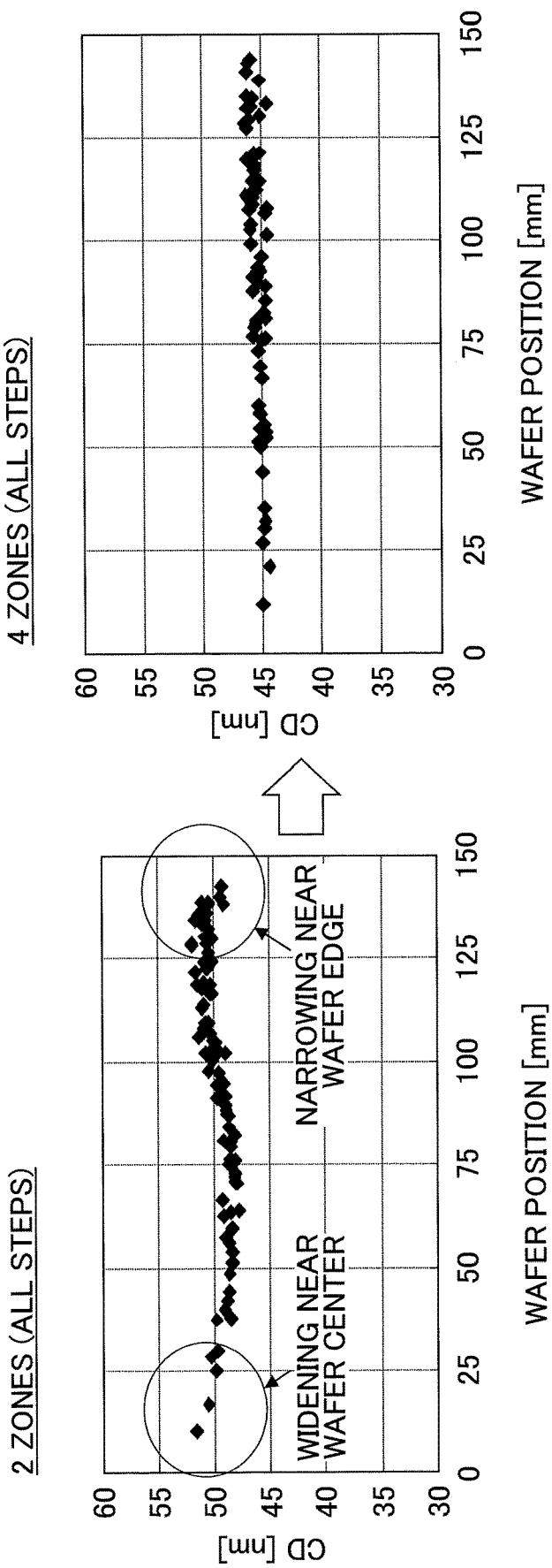
FIG. 8 illustrates process results of implementing temperature control when the heater is divided into two zones and when the heater is divided into four zones.

Based on the correlation between the setting temperatures and the CDs as described above, calculations were made to obtain optimal setting temperatures for the four zones of the heater 75 upon performing the process steps illustrated in FIG. 5, the optimal setting temperatures were prescribed in a recipe, and the process steps of FIG. 5 were performed according to the recipe. The right side graph of FIG. 8 represents process results obtained from performing the process steps according to the recipe. The left side graph of FIG. 8 illustrates the process results in the case where the heater 75 is divided into two zones as a comparison example. As can be appreciated by comparing the left side and right side graphs of FIG. 8, in the case where temperature control is implemented with respect to the heater 75 that is divided into four zones, the "widening near wafer center" and the "narrowing near wafer edge" of the CD that occur when the heater 75 is divided into two zones cannot be observed thereby indicating that in-plane uniformity of the wafer temperature can be achieved. Note that the setting temperatures of the center zone/edge zone during the etching process step for etching the BARC film 102 in the case of implementing the 2-zone temperature control were prescribed to be 60/50° C., and the setting temperatures of the center zone/edge zone during the etching process step for etching the silicon nitride film 106 in the case of implementing the 2-zone temperature control were prescribed to be 35/35° C. Also, the setting temperatures of the center zone/inner middle zone/outer middle zone/edge zone during the etching process step for etching the BARC film 102 in the case of implementing the 4-zone temperature control were prescribed to be 60/45/45/43° C., and the setting temperatures of the center zone/inner middle zone/outer middle zone/edge zone during the etching process step for etching the silicon nitride film 106 in the case of implementing the 4-zone temperature control were prescribed to be 40/45/50/50° C.

(Zone Area)

Figure 9:
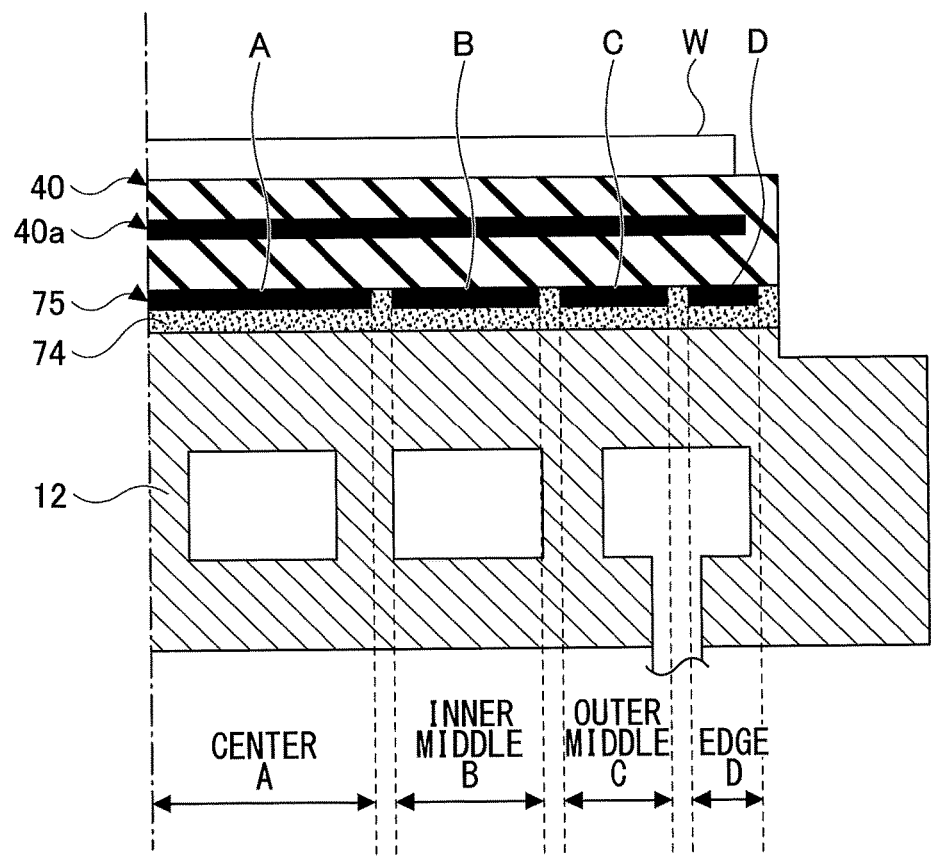
FIG. 9 illustrates an exemplary arrangement of the areas of the zones and power switching at the zones of the heater according to an embodiment of the present invention.
Figure 10:
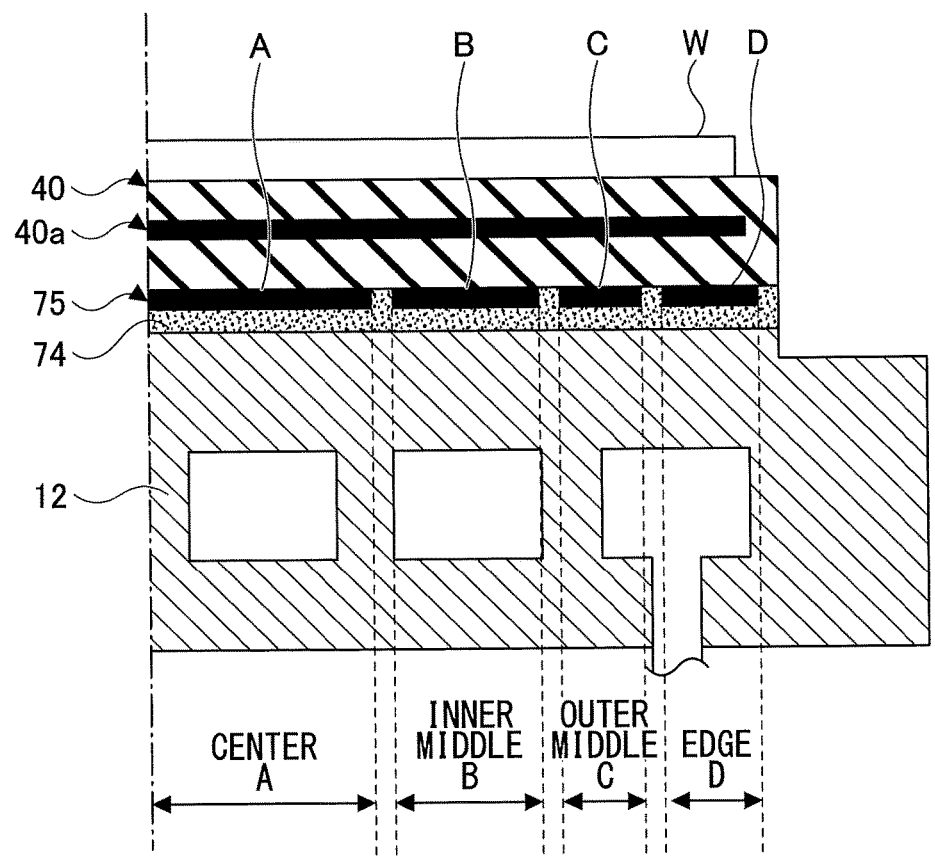
FIG. 10 illustrates another exemplary arrangement of the areas of the zones and power switching at the zones of the heater according to an embodiment of the present invention.

In the following, the areas of the zones are described with reference to FIGS. 9 and 10. FIGS. 9 and 10 illustrate exemplary embodiments of the heater 75 that is divided into four zones. In FIG. 9, the center zone A has the largest area, and the four zones have areas that become gradually smaller from the center zone A toward the edge zone D. That is, the area of the heater zone at the outermost edge is the smallest. In this embodiment, temperature control may be more intricately performed as the temperature control position comes closer toward the outermost periphery, and in this way, temperature uniformity may be improved.

In FIG. 10, the center zone A has the largest area, and the areas of the zones become smaller from the center zone A toward the outer middle zone C. However, the area of the outer middle zone C is smaller than the edge zone D. That is, the outer middle zone C, which is second closest to the outermost periphery, has the smallest area. In this embodiment, temperature control may be more intricately performed with respect to the outermost middle zone positioned toward the inner side with respect to the outermost edge zone, and in this way, temperature uniformity may be improved.

(Power Switching)

In the heater 75 having the configurations as illustrated in FIGS. 9 and 10, the AC power supply 44 may be switched on/off at the middle zones (inner middle zone B and/or outer middle zone C). For example, in FIG. 10, by switching on/off the power of the outer middle zone C having the smallest zone area, temperature interference from the outer middle zone C to its adjacent zones D and B may be prevented. In this way, temperature control may be implemented based on the correlation between the temperatures of the adjacent zones D and B, and temperature controllability of the wafer W may be improved in some cases. Also, by turning off the power of the heater of one or more zones, energy consumption may be reduced.

On the other hand, the AC power supply 44 may not be switched on/off at the center zone A and the edge zone D. This is because plasma exists at a high density around the wafer center and heat tends to be trapped within the outermost region of the wafer to be prevented from escaping outside as described above. That is, the center zone A and the edge zone D have anomalies in their temperature distributions such that temperature control at these regions is believed to be indispensable.

As described above, in the plasma processing apparatus 1 including the heater 75 according to an embodiment of the present invention, the heater 75 arranged within or near the electrostatic chuck 40 is divided into at least four zones. In this way, temperature control may be separately implemented with respect to the center zone A and the outermost edge zone D in which anomalies occur due to plasma conditions and/or the apparatus configuration, for example. Also, by dividing the middle region into at least two zones, temperature control of the heater may be more intricately conducted. As a result, in-plane uniformity of the wafer temperature may be achieved. Note that in the case where the size (diameter) of the wafer is greater than or equal to 450 mm, the area of the middle region becomes relatively large and accurate temperature control of the middle region becomes difficult. Thus, in a preferred embodiment, the middle region may be subdivided into smaller zones according to the size of the wafer upon implementing temperature control.

[Heater Temperature Control Method]

In the present embodiment, the heater 75 is divided into four zones. The center zone A and the edge zone D each have one zone arranged adjacent thereto. The middle zones B and C in the middle region each have two zones arranged adjacent thereto. The zones receive temperature interference from their adjacent zones. Notably, the middle zones B and C in the middle region receive temperature interference from both sides. In view of the above, more accurate temperature control may be possible by correcting the temperature interference from the adjacent zones with respect to the setting temperatures of the zones.

Also, note that because the surface of the electrostatic chuck 40 is positioned above the heater 75, the surface temperature of the electrostatic chuck 40 may not always be equal to the setting temperatures of the zones. That is, a deviation may occur between the surface temperature of the electrostatic chuck 40 and the temperature of the heater 75. Thus, more accurate temperature control may be possible by correcting such a deviation.

In the following, a heater temperature control method is described that involves correcting the temperature interference from adjacent zones, correcting the deviation between the temperature of the heater 75 and the surface temperature of the electrostatic chuck 40, and using a corrected temperature obtained by performing the above corrections to control the temperature of the heater 75 at each of the zones.

Figure 18:
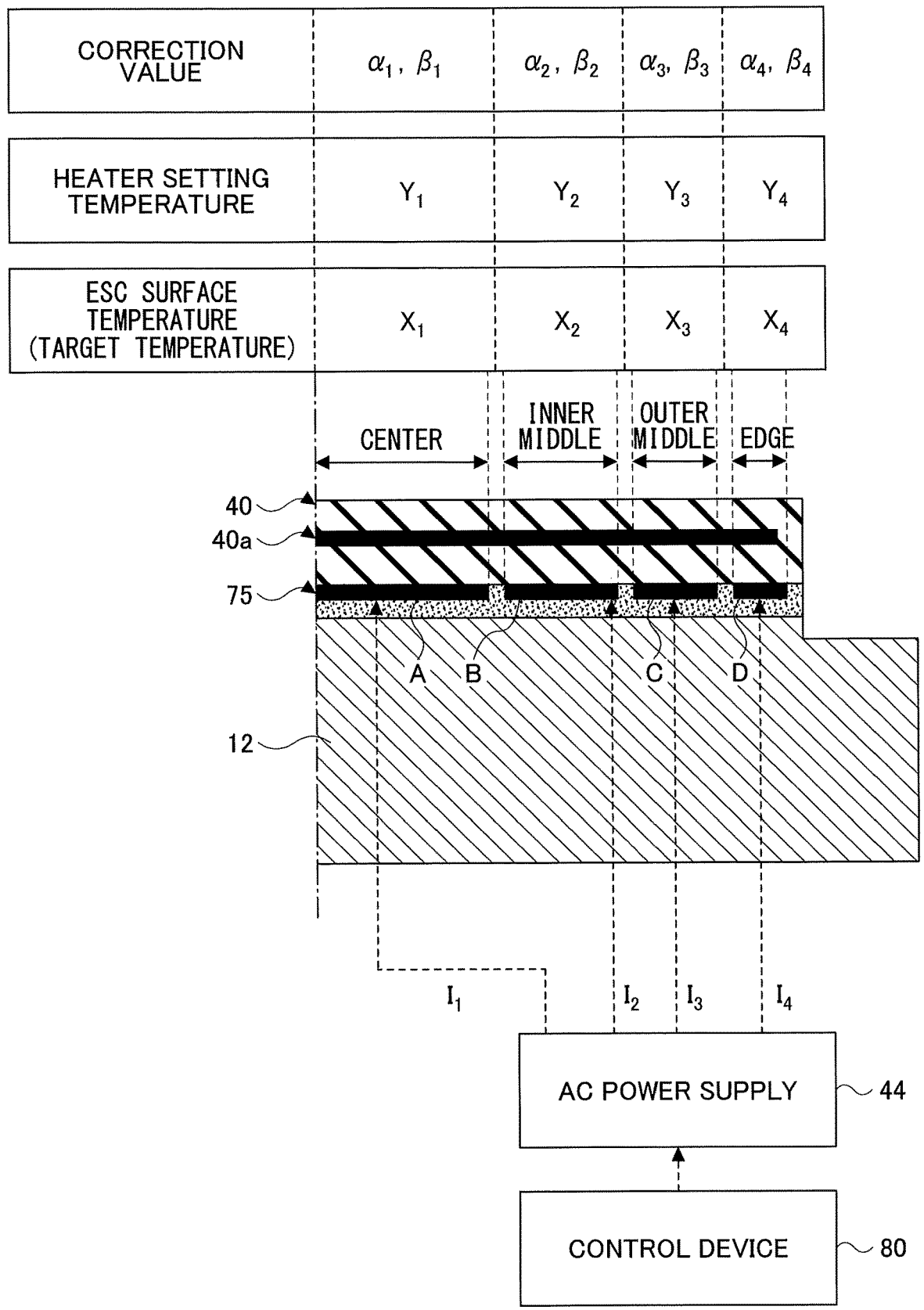
FIG. 18 illustrates corrections implemented with respect to the setting temperatures of the zones and corresponding input current values to be applied to the zones.

Note that in the following descriptions, as illustrated in FIG. 18, first correction values for correcting deviations of the surface temperature of the electrostatic chuck 40 with respect to the setting temperatures of the center zone A, the inner middle zone B, the outer middle zone C, and the edge zone D are represented as $\alpha_1$, $\alpha_2$, $\alpha_3$, and $\alpha_4$ respectively. Also, second correction values for correcting the temperature interferences from zones adjacent to the center zone A, the inner middle zone B, the outer middle zone C, and the edge zone D are represented as $\beta_1$, $\beta_2$, $\beta_3$, and $\beta_4$ respectively. Further, the temperature sensor 77 is used in setting up the above correction values. As illustrated in FIG. 11, in the present embodiment, the temperature sensor 77 is arranged on the backside surface of the heater 75 within the inner middle zone B. However, the position of the temperature sensor 77 is not limited to the above, and the temperature sensor 77 may be arranged in other zones as well. Also, the number of temperature sensors 77 arranged on the heater 75 is not limited to one. In some embodiments, a plurality of temperature sensors may be arranged. In a preferred embodiment, at least three temperature sensors are arranged on a circumference of a circle. For example, in FIG. 12, four temperature sensors 77a, 77b, 77c, and 77d are arranged on a circumference of a circle. In this way, a temperature distribution in the circumferential direction may be accurately detected.

[Functional Configuration of Control Device 80]

The above heater temperature control method may be executed by the control device 80. In the following, a functional configuration of the control device 80 is described with reference to FIG. 13, and operations of the control device 80 are described thereafter with reference to FIG. 19.

Figure 13:
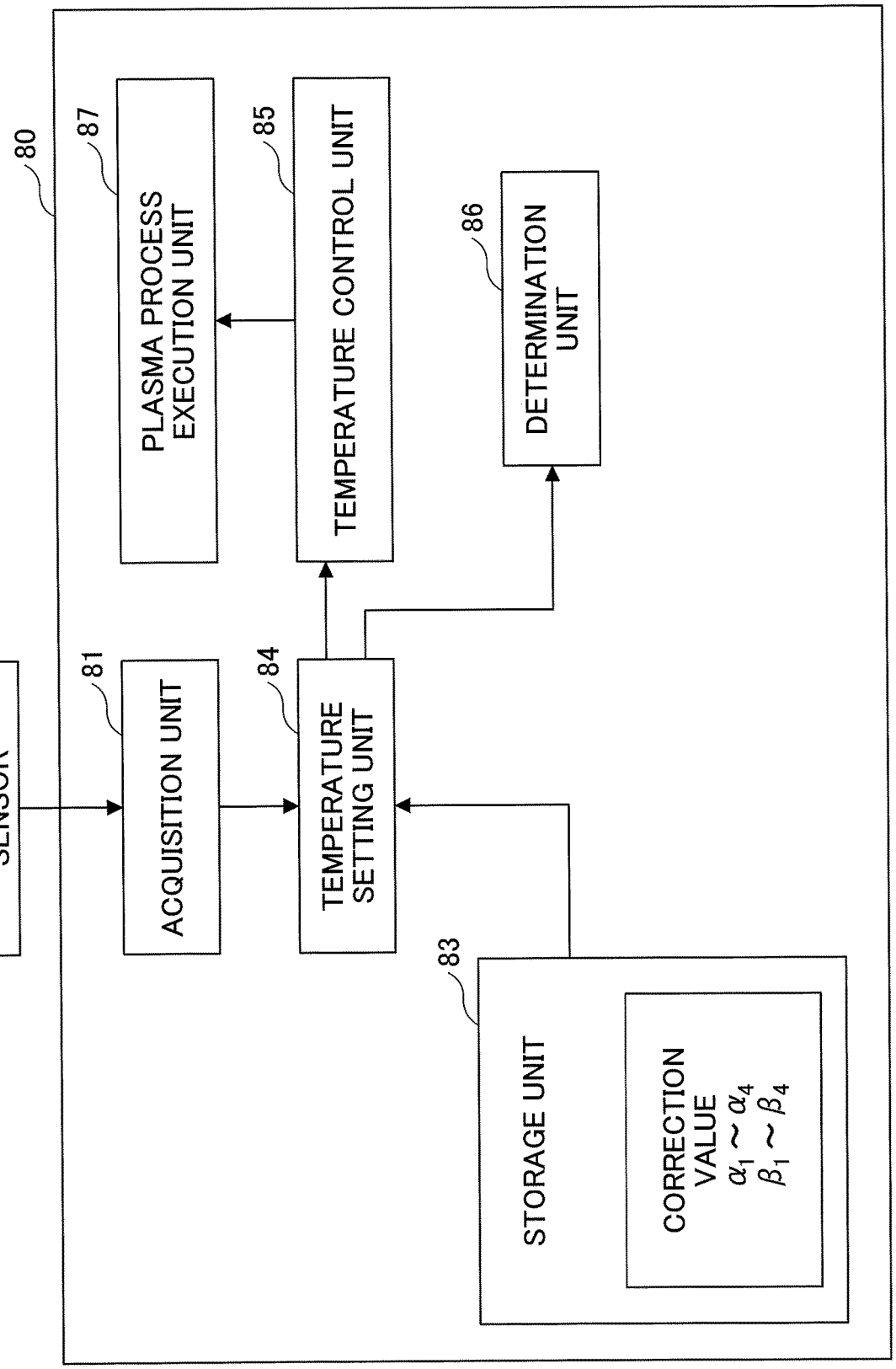
FIG. 13 illustrates a functional configuration of a control device according to an embodiment of the present invention.

FIG. 13 illustrates the functional configuration of the control device 80. The control device 80 includes an acquisition unit 81, a storage unit 83, a temperature setting unit 84, a temperature control unit 85, a determination unit 86, and a plasma process execution unit 87.

The acquisition unit 81 continually inputs the temperature of the backside surface of the heater 75 detected by the temperature sensor 77. In the case where a plurality of temperature sensors 77 are arranged, the acquisition unit 81 may input the temperatures detected by the plurality of temperature sensors 77.

The temperature setting unit 84 calculates the first values $\alpha_1$, $\alpha_2$, $\alpha_3$, and $\alpha_4$ for correcting the deviations of the surface temperature of the electrostatic chuck 40 with respect to the setting temperatures of the zones, and the second values $\beta_1$, $\beta_2$, $\beta_3$, and $\beta_4$ for correcting the temperature interferences from adjacent zones with respect to the setting temperatures of the zones, and stores the calculated correction values in the storage unit 83. Note that methods for calculating the correction values are described in detail below.

The storage unit 83 stores a correlation between the setting temperatures of the zones and current values to be applied to the heater 75 such that the zones may be controlled to control temperatures that are corrected based on the first values $\alpha_1$, $\alpha_2$, $\alpha_3$, and $\alpha_4$, and the second values $\beta_1$, $\beta_2$, $\beta_3$, and $\beta_4$. Also, the storage unit 83 may store process recipes prescribing the steps and conditions of a process. For example, a process recipe stored in the storage unit 83 may prescribe the steps and the process conditions for executing each step of the process illustrated in FIG. 5.

The temperature control unit 85 adjusts the control temperature of the heater 75 with respect to each of the zones. The temperature control unit 85 may correct the deviation of the surface temperature of the electrostatic chuck 40 with respect to the setting temperature of each of the zones upon adjusting the control temperature of the heater 75 with respect to each of the zones. Also, the temperature control unit 85 may correct the temperature interference from an adjacent zone with respect to the setting temperature of each of the zones upon adjusting the control temperature of the heater 75 with respect to each of the zones. The temperature control unit 85 may make one of the above adjustments or both of the above adjustments, for example. In making the above adjustments, the temperature control unit 85 may adjust the control temperature of the heater 75 with respect to each of the zones based on at least one of the first values $\alpha_1$, $\alpha_2$, $\alpha_3$, and $\alpha_4$, and the second values $\beta_1$, $\beta_2$, $\beta_3$ and $\beta_4$ stored in the storage unit 83. In this case, the temperature control unit 85 may set up the temperature detected by the temperature sensor 77 arranged in a given zone as a setting temperature of the corresponding zone, and calculate the current value to be applied to each of the zones of the heater 75 based on the correlation between the setting temperatures of the zones and the current values to be applied to the zones stored in the storage unit 83.

The determination unit 86 determines that it is time to replace the electrostatic chuck 40 when at least one of the calculated current values for the heater of each of the zones is less than a threshold value. That is, as the heater 75 is repeatedly used, the heater 75 may be detached from the ceramic portion of the electrostatic chuck 40 due to thermal expansion, for example. In such case, the detached portion may be retained at a high temperature, and as a result, the current value may decrease. Note that the threshold value may be stored in the storage unit 83, for example.

The plasma process execution unit 87 executes a plasma etching process according to a relevant process recipe stored in the storage unit 83.

[Correction Value Calculation]

In the following, correction functions for obtaining heater setting temperatures $Y_1$, $Y_2$, $Y_3$, and $Y_4$ are described. Specifically, methods for calculating the first values $\alpha_1$, $\alpha_2$, $\alpha_3$, and $\alpha_4$, and the second values $\beta_1$, $\beta_2$, $\beta_3$, and $\beta_4$; and obtaining corrected heater control temperatures using the first values $\alpha_1$, $\alpha_2$, $\alpha_3$, and $\alpha_4$, and the second values $\beta_1$, $\beta_2$, $\beta_3$, and $\beta_4$ are described with reference to FIGS. 14-18. FIG. 14 illustrates a method of calculating the correction values $\alpha_1$ and $\beta_1$ with respect to the heater setting temperature $Y_1$ according to the present embodiment. FIG. 15 illustrates a method of calculating the correction values $\alpha_2$ and $\beta_2$ with respect to the heater setting temperature $Y_2$ according to the present embodiment, FIG. 16 illustrates a method of calculating the correction values $\alpha_3$ and $\beta_3$ with respect to the setting temperature $Y_3$ according to the present embodiment, and FIG. 17 illustrates a method of calculating the correction values $\alpha_4$ and $\beta_4$ with respect to the heater setting temperature $Y_4$ according to the present embodiment. FIG. 18 illustrates corrections implemented with respect to the setting temperatures of the zones and input current values to be applied to the zones.

As described below, by correcting the temperature interferences from adjacent zones and correcting the deviations of the surface temperature of the electrostatic chuck 40 with respect to the setting temperatures of the heater 75 to obtain corrected heater control temperatures and applying to the heater 75 input current values corresponding to the corrected heater control temperatures of the heater 75, the temperature of the heater 75 may be more accurately controlled.

In the following descriptions, variables $X_1$, $X_2$, $X_3$, and $X_4$ represent target temperatures of the center zone A, the inner middle zone B, the outer middle zone C, and the edge zone D; that is, temperatures to which the surface temperatures of the electrostatic chuck 40 at the above zones should actually be controlled. Variables $Y_1$, $Y_2$, $Y_3$, and $Y_4$ represent setting temperatures of the heater 75 at the center zone A, the inner middle zone B, the outer middle zone C, and the edge zone D. Variables $Z_1$, $Z_2$, and $Z_3$ represent adjacent temperatures as temperature interferences from adjacent zones. Specifically, referring to FIG. 14, the adjacent temperature interfering with the center zone A is represented by the variable $Z_1$. Referring to FIG. 15, the adjacent temperatures interfering with the inner middle zone B are represented by the variables $Z_1$ and $Z_2$; referring to FIG. 16, the adjacent temperatures interfering with the outer middle zone C are represented by the variables $Z_2$ and $Z_3$; and referring to FIG. 17, the adjacent temperature interfering with the edge zone D is represented by the variable $Z_3$.

Note that the variables $X_1$, $X_2$, $X_3$, and $X_4$ representing the target temperatures of the zones (surface temperature of the electrostatic chuck 40) and the variables $Z_1$, $Z_2$, and $Z_3$ representing the adjacent temperatures are measured using infrared (IR) spectroscopy. The variables $Y_1$, $Y_2$, $Y_3$, and $Y_4$ representing setting temperatures of the heater 75 are measured using a fluorescence thermometer.

For example, with respect to the heater 75 at the center zone A, the relationship between the heater setting temperature $Y_1$ and the target temperature $X_1$ taking into account the influence of the adjacent temperature $Z_1$ may be expressed by the following formula (1):

$$Y_1=\alpha_1 X_1+\beta_1(Z_1) \tag{1}$$

The graph in FIG. 14 represents the linear function expressed by the above formula (1). If the surface temperature of the electrostatic chuck 40 were actually measured, the slope $\alpha_1$ will remain the same as long as there is no influence from the adjacent temperature $Z_1$. In the present example, it is assumed that $\beta_1(Z_1)$ is constant. In a case where the temperature sensor 77 detects a sensor temperature $T_1$ at the backside surface of the center zone A, the heater setting temperature $Y_1$ may be set equal to the sensor temperature $T_1$ corresponding to an actual measurement value. Thus, the first correction value $\alpha_1$ and the second correction value $\beta_1$ may be calculated by obtaining actual measurements of the heater setting temperature $Y_1$ (=sensor temperature $T_1$) and the surface temperature $X_1$ of the electrostatic chuck 40 at two or more different points.

Similarly, with respect to the heater at the inner middle zone B, the relationship between the heater setting temperature $Y_2$ and the target temperature $X_2$ taking into account the influence of the adjacent temperatures $Z_1$ and $Z_2$ may be expressed by the following formula (2):

$$Y_2=\alpha_2 X_2+\beta_2(Z_1,Z_2) \tag{2}$$

The graph in FIG. 15 represents the linear function expressed by the above formula (2). It is assumed in the present example that the adjacent temperatures $Z_1$ and $Z_2$ are fixed values of a certain conceivable combination for implementing temperature control and $\beta_1(Z_1, Z_2)$ is constant. In a case where the temperature sensor 77 detects a sensor temperature $T_2$ at the backside surface of the inner middle zone B, the heater setting temperature $Y_2$ may be set equal to the sensor temperature $T_2$ corresponding to an actual measurement value. Thus, the first correction value $\alpha_2$ and the second correction value $\beta_2$ may be calculated by obtaining actual measurements of the heater setting temperature $Y_2$ (=sensor temperature $T_2$) and the surface temperature $X_2$ of the electrostatic chuck 40 at two or more different points.

Similarly, the first correction values $\alpha_3$ and $\alpha_4$, and the second correction values $\beta_3$ and $\beta_4$ for controlling the temperatures at the outer middle zone C and the edge zone D may be calculated based on the following formulas (3) and (4):

$$Y_3=\alpha_3 X_3+\beta_3(Z_2,Z_3) \tag{3}$$

$$Y_4=\alpha_4 X_9+\beta_4(Z_3) \tag{4}$$

Note that the linear function expressed by formula (3) is represented by the graph of FIG. 16, and the linear function expressed by formula (4) is represented by the graph of FIG. 17. Also, it is assumed in the above examples that the heater setting temperature $Y_3$=sensor temperature $T_3$, and the heater setting temperature $Y_4$=sensor temperature $T_4$.

In this way, the temperature setting unit 84 may calculate in advance all the correction values indicated in FIG. 18 for all conceivable combinations of temperature setting values of the adjacent zones. The calculated first correction values $\alpha_1$, $\alpha_2$, $\alpha_3$, and $\alpha_4$, and the second values $\beta_1$, $\beta_2$, $\beta_3$, and $\beta_4$, are stored in the storage unit 83. Also, the storage unit 83 stores a correlation between the setting temperatures $Y_1$, $Y_2$, $Y_3$, and $Y_4$ of the zones and current values $I_1$, $I_2$, $I_3$, and $I_4$ to be applied to the zones of the heater 75 such that the heater temperatures at the zones may be equal to the control temperatures calculated for the zones based on the first correction values $\alpha_1$, $\alpha_2$, $\alpha_3$, and $\alpha_4$, and the second correction values $\beta_1$, $\beta_2$, $\beta_3$, and $\beta_4$.

According to the above correction value calculation methods, relative relationships with respect to temperature variations between adjacent zones are determined beforehand, and the temperature of one zone is actually measured and the measured temperature is used as a base temperature to obtain input current values to be applied to the zones of the heater 75. In this way, correction-implemented temperature control may be performed on the zones of the heater 75.

Note that in the above descriptions, for example, with respect to the heater 75 at the inner middle zone B, the relationship is approximated using $\beta_2(Z_1, Z_2)$ as the influence from adjacent zones. However, correction accuracy may be further improved by additionally taking into account influences from other zones that are not directly adjacent to the zone of interest. For example, with respect to the heater 75 at the inner middle zone B, the relationship may be approximated taking into account influences not only from the center zone A and the outer middle zone C but also the edge zone D using $\beta_2(Z_1, Z_2, Z_3)$ (see formula (6) indicated below). In this way, correction accuracy may be further improved. Similarly, correction values may be calculated in advance taking into account influences not only from adjacent zones but other remote zones using formulas (5)-(8) indicated below.

$$Y_1=\alpha_1 X_1+\beta_1(Z_1,Z_2,Z_3) \tag{5}$$

$$Y_2=\alpha_2 X_2+\beta_2(Z_1,Z_2,Z_3) \tag{6}$$

$$Y_3=\alpha_3 X_3+\beta_3(Z_1,Z_2,Z_3) \tag{7}$$

$$Y_4=\alpha_4 X_4+\beta_4(Z_1,Z_2,Z_3) \tag{8}$$

Further, in a case where the power of the outer middle zone C is turned off, temperature interference from the outer middle zone C may be disregarded. Accordingly, the relationship between the setting temperatures of the zones of the heater 75 and the target temperatures may be expressed by the following formulas (9)-(11):

$$Y_1=\alpha_1 X_1+\beta_1(Z_1,Z_3) \tag{9}$$

$$Y_2=\alpha_2 X_2+\beta_2(Z_1,Z_3) \tag{10}$$

$$Y_4=\alpha_4 X_4+\beta_4(Z_1,Z_3) \tag{11}$$

[Control Device Operations]

Figure 19:
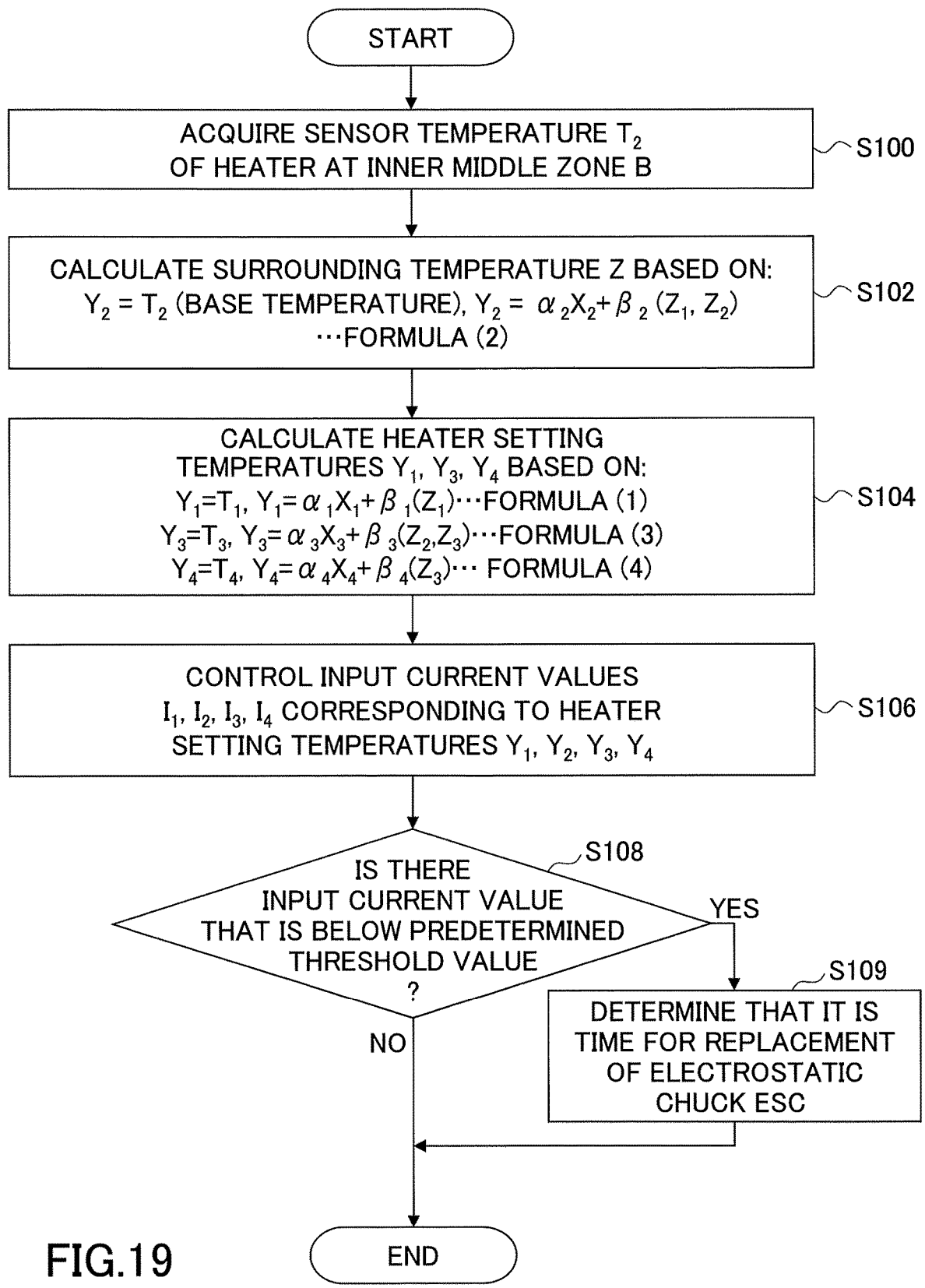
FIG. 19 is a flowchart illustrating process steps of a temperature control process according to an embodiment of the present invention.

Lastly, operations of the control device 80; namely, temperature control operations executed by the control device 80 are described below with reference to the flowchart of FIG. 19. Note that in the present example, Z represents the adjacent temperature of an adjacent zone. As described above, the first correction values $\alpha_1$-$\alpha_4$ and the second correction values $\beta_1$-$\beta_4$ for the zones are calculated in advance and stored in the storage unit 83. Also, the correlation between the corrected heater setting temperatures $Y_1$-$Y_4$ and the input current values $I_1$-$I_4$ is stored in the storage unit 83.

When the present process is started, first, the acquisition unit 81 acquires the sensor temperature $T_2$ detected by the temperature sensor 77 that is arranged at the inner middle zone B (step S100). Then, the temperature setting unit 84 uses the sensor temperature $T_2$ as a base temperature, assigns the sensor temperature $T_2$ to the heater setting temperature $Y_2$ of formula (2), assigns a target value to the target temperature $X_2$ of formula (2), and calculates the adjacent temperatures Z of adjacent zones (step S102).

$$Y_2=\alpha_2 X_2+\beta_2(Z_1,Z_2) \quad (2)$$

Then, using formulas (1), (3), and (4), the temperature setting unit 84 assigns target values to the target temperatures $X_1$, $X_3$, and $X_4$, and assigns the adjacent temperatures Z of the adjacent zones to calculate the heater setting temperatures $Y_1$, $Y_3$, and $Y_4$ (step S104).

$$Y_1=\alpha_1 X_1+\beta_1(Z_1) \quad (1)$$

$$Y_3=\alpha_3 X_3+\beta_3(Z_2,Z_3) \quad (3)$$

$$Y_4=\alpha_4 X_4+\beta_4(Z_3) \quad (4)$$

Then, based on the correlation between the setting temperatures of the zones and the current values I stored in the storage unit 83, the temperature control unit 85 calculates the heater input current values $I_1$, $I_2$, $I_3$, and $I_4$ corresponding to the heater setting temperatures $Y_1$, $Y_2$, $Y_3$, and $Y_4$, and applies the heater input current values $I_1$, $I_2$, $I_3$, and $I_4$ to the corresponding zones of the heater 75 to thereby control the heater temperatures at the corresponding zones (step S106).

Then, the determination unit 86 determines whether any of the heater input current values $I_1$, $I_2$, $I_3$, and $I_4$ is less than a predetermined threshold value. Upon determining that at least one of the heater input current values $I_1$, $I_2$, $I_3$, and $I_4$ is less than the predetermined threshold value, the determination unit 86 determines that it is time to replace the electrostatic chuck 40 (step S108) after which the present process is ended. When the determination unit 86 determines that none of the heat input current values $I_1$, $I_2$, $I_3$, and $I_4$ is less than the predetermined threshold value, the present process is immediately ended.

[Effects]

As described above, in the plasma processing apparatus 1 including the heater 75 according to an embodiment of the present invention, the heater 75 arranged within or near the electrostatic chuck 40 is divided into at least four zones. In this way, temperature control may be separately implemented with respect to the center zone A and the outermost edge zone D where anomalies are likely to occur due to plasma conditions or the apparatus configuration. Also, more intricate temperature control of the heater 75 may be enabled by dividing the middle region into at least two zones. As a result, in-plane uniformity of the wafer temperature may be achieved.

Also, the zones receive temperature interference from adjacent zones. The middle zones are particularly susceptible to large temperature interferences. Accordingly, in a temperature control method that may be implemented by the plasma processing apparatus 1 of the present embodiment, correction may be implemented on temperature interferences from adjacent zones with respect to the setting temperatures of the zones. Also, the setting temperatures of the zones may incorporate corrections on deviations in the surface temperature of the electrostatic chuck 40 arranged above the heater 75. In this way, highly accurate temperature control may be enabled.

Although illustrative embodiments of the present invention have been described above with reference to the accompanying drawings, the present invention is not limited to these embodiments. That is, numerous variations and modifications will readily occur to those skilled in the art, and the present invention includes all such variations and modifications that may be made without departing from the scope of the present invention.

For example, although a plasma etching process is described above as an example of a plasma process that may be executed by a plasma processing apparatus, the present invention is not limited to plasma etching, but may also be applied to plasma processing apparatuses that perform plasma chemical vapor deposition (CVD) for forming a thin film on a wafer through CVD, plasma oxidation, plasma nitridization, sputtering, or ashing, for example.

Also, a plasma processing apparatus according to the present invention is not limited to a capacitively coupled plasma processing apparatus that generates capacitively coupled plasma (CCP) by discharging a high frequency generated between parallel plate electrodes within a chamber. For example, the present invention may also be applied to an inductively coupled plasma processing apparatus that has an antenna arranged on or near a chamber and is configured to generate inductively coupled plasma (ICP) under a high frequency induction field, or a microwave plasma processing apparatus that generates a plasma wave using microwave power.

Also, the workpiece subject to a plasma process in the present invention is not limited to a semiconductor wafer but may be a large substrate for a flat panel display (FPD), an electroluminescence (EL) element, or a substrate for a solar battery, for example.

Also, according to an embodiment of the present invention, the heater may be arranged such that the center zone and the at least two middle zones have areas that become smaller toward the outer periphery side, and an outermost middle zone of the at least two middle zones has an area that is smaller than an area of the edge zone arranged at the outer periphery side of the outermost middle zone.

Also, in another embodiment of the present invention, the heater may be arranged such that the center zone, the at least two middle zones, and the edge zone have areas that become smaller toward the outer periphery side.

Also, the temperature control unit may turn off the heater of the outermost middle zone and adjust the control temperature of the heater of the zones other than the outermost middle zone.

Also, the temperature control unit may correct a deviation of a surface temperature of the electrostatic chuck with respect to a setting temperature of each of the zones upon adjusting the control temperature of the heater with respect to each of the zones.

Also, the temperature control unit may correct a temperature interference from an adjacent zone with respect to a setting temperature of each of the zones upon adjusting the control temperature of the heater with respect to each of the zones.

Also, a plasma processing apparatus according to an embodiment of the present invention may further include a temperature setting unit configured to set up a first correction value for correcting a deviation of a surface temperature of the electrostatic chuck with respect to the setting temperature of each of the zones and a second correction value for correcting the temperature interference from the adjacent zone with respect to the setting temperature of each of the zones. The temperature control unit may adjust the control temperature of the heater with respect to each of the zones based on the first correction value and the second correction value.

Also, the temperature setting unit may store in advance in a storage unit a correlation between the setting temperature of each of the zones and a current value to be applied to the heater of each of the zones to control the heater to the control temperature that is calculated with respect to each of the zones based on the first correction value and the second correction value. The temperature control unit may acquire a temperature detected by a temperature sensor arranged in at least one zone of the plurality of zones, set up the acquired temperature as a setting temperature of the at least one zone, and calculate the current value to be applied to the heater of each of the zones based on the setting temperature of the at least one zone and the correlation stored in the storage unit.

Also, a plasma processing apparatus according to an embodiment of the present invention may further include a determination unit configured to determine that a time for replacement of the electrostatic chuck has been reached when at least one current value of the calculated current value for the heater of each of the zones is less than a predetermined threshold value.

Also, at least three temperature sensors may be arranged along a circumference of a circle within the at least one zone.

Also, a plasma processing apparatus according to an embodiment of the present invention may further include a coolant path arranged opposite the heater, which is arranged within or near the mounting table; and a chiller device configured to circulate a coolant within the coolant path.

Also, the mounting table may hold a workpiece having a diameter greater than or equal to 450 mm, and the middle zones of the heater may be concentrically divided into at least three zones.

The present application is based on and claims the benefit of priority of Japanese Patent Application No. 2012-005590 filed on Jan. 13, 2012, and U.S. Provisional Application No. 61/587,706 filed on Jan. 18, 2012, the entire contents of which are herein incorporated by reference.

DESCRIPTION OF THE REFERENCE NUMERALS

| | |
|---|---|
| 1 | plasma processing apparatus |
| 10 | chamber |
| 12 | mounting table (lower electrode) |
| 31 | first high frequency power supply |
| 32 | second high frequency power supply |
| 38 | shower head (upper electrode) |
| 40 | electrostatic chuck |
| 44 | AC power supply |
| 62 | gas supply source |
| 70 | coolant path |
| 71 | chiller unit |
| 75 | heater |
| 77 | temperature sensor |
| 80 | control device |
| 81 | acquisition unit |
| 83 | storage unit |
| 84 | temperature setting unit |
| 85 | temperature control unit |
| 86 | determination unit |
| 87 | plasma process execution unit |
| 100 | photoresist film |
| 102 | BARC film |
| 104 | α-Si film |
| 106 | SiN film |
| 108 | SiO$_2$ film |
| A | center zone |
| B | inner middle zone |
| C | outer middle zone |
| D | edge zone |

The invention claimed is:

1. A method for controlling a temperature of a heater arranged in a plasma processing apparatus that is configured to convert a gas into plasma using a high frequency power and perform plasma processing on a workpiece with the plasma, wherein the plasma processing apparatus includes
a processing chamber that can be depressurized,
a mounting table that is arranged within the processing chamber and that is configured to hold the workpiece,
an electrostatic chuck that is arranged on the mounting table and that is configured to electrostatically attract the workpiece by applying a voltage to a chuck electrode, and
a heater arranged within or near the electrostatic chuck, the heater being divided into a plurality of heater zones,
the heater temperature control method comprising:
adjusting a control temperature of the heater with respect to each of the plurality of heater zones; and
correcting a temperature interference from an adjacent heater zone with respect to a setting temperature of each of the heater zones upon adjusting the control temperature of the heater with respect to each of the heater zones.

2. The temperature control method according to claim 1, further comprising:
setting a first correction value to correct for a deviation of a surface temperature of the electrostatic chuck with respect to the setting temperature of each of the heater zones; and
setting a second correction value to correct for the temperature interference from the adjacent heater zone with respect to the setting temperature of each of the heater zones;
wherein the control temperature of the heater with respect to each of the heater zones is adjusted based on the first correction value and the second correction value.

3. The temperature control method according to claim 2, wherein the method further comprises:
storing in a memory of the plasma processing apparatus, in advance, a correlation between the setting temperature of each of the heater zones and a current value to be applied to the heater of each of the heater zones to control the temperature of the heater to the control temperature that is calculated with respect to each of the heater zones, based on the first correction value and the second correction value;
acquiring a temperature detected by a temperature sensor arranged in at least one heater zone of the plurality of heater zones;
setting the acquired temperature as a setting temperature of the at least one heater zone; and
calculating the current value to be applied to the heater of each of the heater zones based on the setting temperature of the at least one heater zone and the stored correlation.

4. The temperature control method according to claim 3, wherein the method further comprises:
comparing the calculated current value for the heater of each of the heater zones with a predetermined threshold value; and
determining that the electrostatic chuck is due for replacement when at least one current value of the calculated current value for the heater of each of the heater zones is below the predetermined threshold value.

* * * * *